(12) United States Patent
Richardson et al.

(10) Patent No.: US 10,221,496 B2
(45) Date of Patent: *Mar. 5, 2019

(54) COPPER FILLING OF THROUGH SILICON VIAS

(75) Inventors: Thomas B. Richardson, Killingworth, CT (US); Wenbo Shao, Milford, CT (US); Xuan Lin, Northford, CT (US); Cai Wang, Woodbridge, CT (US); Vincent Paneccasio, Jr., Madison, CT (US); Joseph A. Abys, Guilford, CT (US); Yun Zhang, Warren, NJ (US); Richard Hurtubise, Clinton, CT (US); Chen Wang, New Haven, CT (US)

(73) Assignee: MacDermid Enthone Inc., Waterbury, CT (US)

( * ) Notice: Subject to any disclaimer, the term of this patent is extended or adjusted under 35 U.S.C. 154(b) by 1334 days.

This patent is subject to a terminal disclaimer.

(21) Appl. No.: 13/699,910

(22) PCT Filed: May 24, 2011

(86) PCT No.: PCT/US2011/037777
§ 371 (c)(1),
(2), (4) Date: Dec. 12, 2012

(87) PCT Pub. No.: WO2011/149965
PCT Pub. Date: Dec. 1, 2011

(65) Prior Publication Data
US 2013/0199935 A1  Aug. 8, 2013
US 2019/0003068 A9  Jan. 3, 2019

Related U.S. Application Data

(63) Continuation of application No. 12/324,335, filed on Nov. 26, 2008, now Pat. No. 8,388,824.
(Continued)

(51) Int. Cl.
C25D 5/02 (2006.01)
C25D 3/38 (2006.01)
(Continued)

(52) U.S. Cl.
CPC ............. *C25D 3/38* (2013.01); *C25D 5/02* (2013.01); *C25D 7/123* (2013.01); *H01L 21/2885* (2013.01); *H01L 21/76898* (2013.01)

(58) Field of Classification Search
CPC .. C25D 3/38; C25D 5/02; C25D 7/123; H01L 21/2885; H01L 21/76898
(Continued)

(56) References Cited

U.S. PATENT DOCUMENTS 3,682,939 A  8/1972  Webster
3,715,289 A  2/1973  Cope, Jr.
(Continued)

FOREIGN PATENT DOCUMENTS

EP  1148156 A2  10/2001
EP  1422320 A1  5/2004
(Continued)

OTHER PUBLICATIONS

International Search Report, PCT/US2011/037777, dated Feb. 29, 2012, 6 pages.
(Continued)

*Primary Examiner* — Stefanie S Wittenberg
(74) *Attorney, Agent, or Firm* — Carmody Torrance Sandak & Hennessey LLP

(57) ABSTRACT

A method for metallizing a through silicon via feature in a semiconductor integrated circuit device substrate. The method comprises immersing the semiconductor integrated circuit device substrate into an electrolytic copper deposition composition, wherein the through silicon via feature has an entry dimension between 1 micrometers and 100 microm-
(Continued)

eters, a depth dimension between 20 micrometers and 750 micrometers, and an aspect ratio greater than about 2:1; and supplying electrical current to the electrolytic deposition composition to deposit copper metal onto the bottom and sidewall for bottom-up filling to thereby yield a copper filled via feature. The deposition composition comprises (a) a source of copper ions; (b) an acid selected from among an inorganic acid, organic sulfonic acid, and mixtures thereof; (c) an organic disulfide compound; (d) a compound selected from the group consisting of a reaction product of benzyl chloride and hydroxyethyl polyethyleneimine, a quaternized dipyridyl compound, and a combination thereof; and (d) chloride ions.

19 Claims, 26 Drawing Sheets

Related U.S. Application Data

(60) Provisional application No. 61/347,721, filed on May 24, 2010.

(51) Int. Cl.
*H01L 21/288* (2006.01)
*H01L 21/768* (2006.01)
*C25D 7/12* (2006.01)

(58) Field of Classification Search
USPC .......................................................... 205/123
See application file for complete search history.

(56) References Cited

U.S. PATENT DOCUMENTS

| | | | |
|---|---|---|---|
| 3,912,368 A * | 10/1975 | Ponjee | G02F 1/1521 204/224 R |
| 3,919,056 A * | 11/1975 | Habulak | C25D 3/22 205/310 |
| 3,940,320 A | 2/1976 | Kardos et al. | |
| 3,956,078 A | 5/1976 | Kardos et al. | |
| 3,956,084 A | 5/1976 | Kardos et al. | |
| 4,009,087 A | 2/1977 | Kardos et al. | |
| 4,036,710 A | 7/1977 | Kardos et al. | |
| 4,038,161 A | 7/1977 | Eckles et al. | |
| 4,096,133 A | 6/1978 | Zweigle | |
| 4,786,746 A | 11/1988 | Miljkovic | |
| 4,923,576 A * | 5/1990 | Kroll | C25D 3/60 205/253 |
| 4,983,508 A | 1/1991 | Ishiguro et al. | |
| 5,051,154 A | 9/1991 | Bernards et al. | |
| 5,252,196 A | 10/1993 | Sonnenberg et al. | |
| 5,432,052 A | 7/1995 | Ohshima | |
| 5,616,317 A | 4/1997 | Nagase et al. | |
| 5,654,133 A | 8/1997 | Oikawa | |
| 5,824,756 A | 10/1998 | Scriven et al. | |
| 6,444,110 B2 | 9/2002 | Barstad et al. | |
| 6,706,418 B2 | 3/2004 | Egli et al. | |
| 6,776,893 B1 | 8/2004 | Too et al. | |
| 7,128,822 B2 | 10/2006 | Wang et al. | |
| 7,316,772 B2 | 1/2008 | Commander et al. | |
| 7,374,652 B2 | 5/2008 | Hayashi et al. | |
| 7,510,639 B2 | 3/2009 | Wang et al. | |
| 7,651,934 B2 | 1/2010 | Lubomirsky et al. | |
| 7,659,203 B2 | 2/2010 | Stewart et al. | |
| 8,388,824 B2 | 3/2013 | Paneccasio, Jr. et al. | |
| 8,771,495 B2 * | 7/2014 | Paneccasio, Jr. | C25D 3/38 205/118 |
| 2003/0062266 A1 | 4/2003 | Chalyt et al. | |
| 2003/0085133 A1 | 5/2003 | Totsuka et al. | |
| 2003/0168343 A1 | 9/2003 | Commander et al. | |
| 2004/0187731 A1 | 9/2004 | Wang et al. | |
| 2004/0222104 A1 | 11/2004 | Wang et al. | |
| 2004/0231995 A1 | 11/2004 | Murao | |
| 2004/0248381 A1 | 12/2004 | Myrick | |
| 2005/0045486 A1 | 3/2005 | Sahoda et al. | |
| 2005/0045488 A1 | 3/2005 | Paneccasio, Jr. et al. | |
| 2005/0072683 A1 | 4/2005 | Nakada et al. | |
| 2005/0092611 A1 | 5/2005 | Kim et al. | |
| 2005/0263399 A1 | 12/2005 | Shalyt et al. | |
| 2006/0183328 A1 | 8/2006 | Barstad et al. | |
| 2006/0246699 A1 | 11/2006 | Weidman et al. | |
| 2006/0252252 A1 | 11/2006 | Zhu et al. | |
| 2007/0012576 A1 | 1/2007 | Binstead et al. | |
| 2007/0071888 A1 | 3/2007 | Shanmugasundram et al. | |
| 2007/0084732 A1 | 4/2007 | Wang et al. | |
| 2007/0099422 A1 | 5/2007 | Wijekoon et al. | |
| 2009/0035940 A1 | 2/2009 | Richardson et al. | |
| 2010/0068783 A1 * | 3/2010 | Moloney | C03C 17/28 435/177 |
| 2010/0075496 A1 | 3/2010 | Chen et al. | |
| 2010/0084277 A1 | 4/2010 | Park et al. | |
| 2010/0126872 A1 | 5/2010 | Paneccasio, Jr. et al. | |

FOREIGN PATENT DOCUMENTS

| | | |
|---|---|---|
| GB | 1202525 A | 8/1970 |
| WO | 2004016829 A2 | 2/2004 |

OTHER PUBLICATIONS

Written Opinion, PCT/US2011/037777, dated Feb. 29, 2012, 11 pages.
International Preliminary Report on Patentability, PCT/US2011/037777, dated Nov. 27, 2012, 12 pages.
James J Kelly, Chunyan Tian, Alan C West; "Levelling and Microstructural Effects of Additives for Copper Electrodeposition"; pp. 2540-2545; 1999; Journal of The Electrochemical Society, vol. 146, Issue 7.†

\* cited by examiner
† cited by third party

COPPER FILLING OF THROUGH SILICON VIAS

REFERENCE TO RELATED APPLICATIONS

This application is a U.S. national stage application of International Patent Application No. PCT/US2011/037777, filed May 24, 2011, and claims the benefit of U.S. Provisional Application No. 61/347,721, filed May 24, 2010, and is a continuation application of Ser. No. 12/324,335, filed on Nov. 26, 2008, now U.S. Pat. No. 8,388,824, the entire disclosures of which are incorporated herein by reference.

FIELD OF THE INVENTION

The present invention generally relates to a method and composition for filling through silicon vias with copper metallization.

BACKGROUND OF THE INVENTION

The demand for semiconductor integrated circuit (IC) devices such as computer chips with high circuit speed and high circuit density requires the downward scaling of feature sizes in ultra-large scale integration (ULSI) and very-large scale integration (VLSI) structures. The trend to smaller device sizes and increased circuit density requires decreasing the dimensions of interconnect features and increasing their density. An interconnect feature is a feature such as a via or trench formed in a dielectric substrate which is then filled with metal, typically copper, to yield an electrically conductive interconnect. Copper, having better conductivity than any metal except silver, is the metal of choice since copper metallization allows for smaller features and uses less energy to pass electricity. In damascene processing, interconnect features of semiconductor IC devices are metallized using electrolytic copper deposition.

A patterned semiconductor integrated circuit device substrate, for example, a device wafer or die, may comprise both small and large interconnect features. Typically, a wafer has layers of integrated circuitry, e.g., processors, programmable devices, memory devices, and the like, built in a silicon substrate. Integrated circuit (IC) devices have been manufactured to contain small diameter vias and sub-micron sized trenches that form electrical connections between layers of interconnect structure. These features have dimensions on the order of about 150 nanometers or less, such as about 90 nanometers, 65 nanometers, or even 45 nanometers.

Plating chemistry sufficient to copper metallize small size via and trench features has been developed and finds use in the copper damascene method. Copper damascene metallization relies on superfilling additives, i.e., a combination of additives that are referred to in the art as accelerators, levelers, and suppressors. These additives act in conjunction in a manner that can flawlessly fill copper into the interconnect features (often called "superfilling" or "bottom up" growth). See, for example, Too et al., U.S. Pat. No. 6,776,893, Paneccasio et al., U.S. Pat. No. 7,303,992, and Commander et al., U.S. Pat. No. 7,316,772, the disclosures of which are hereby incorporated as if set forth in their entireties. Currently available electrolytic copper deposition systems that rely on superfilling additives can fill small size features at current densities as high as 6 A/dm$^2$ and in as little as 20 seconds, 10 seconds, or less.

In another form, a wafer may be constructed to comprise one or more large diameter via. This type of via architecture is known in the art as "through silicon via" (TSV). In some devices, through silicon via allows electrical interconnection between 2 or more wafers bonded to each other in a three-dimensional wafer stack. After being formed, the 3D wafer stack may be diced into stacked dies ("chips"), each stacked chip having multiple tiers ("layers") of integrated circuitry. Depending on where and when the vias are made, they can be characterized as "Via First—Before FEOL," or "Via First—After BEOL." In both cases, the vias are made before wafer/die attachment or bonding. The third category of TSV is via last, which means that the via is constructed after wafer/die attachment or bonding.

Through silicon vias are critical components of three-dimensional integrated circuits, and they can be found in RF devices, MEMs, CMOS image sensors, Flash, DRAM, SRAM memories, analog devices, and logic devices.

The depth of a TSV depends on the via type (via first or via last), and the application. Via depth can vary from 20 microns to 500 microns, typically between about 50 microns and about 250 microns. Via openings in TSV have had entry dimensions, such as the diameter, on the order of between about 200 nm to about 200 microns, typically between about 25 microns and about 75 microns.

Filling large size through silicon via in commercially practicable durations is a barrier to the commercial feasibility of devices employing TSV. Experimental data obtained to date suggests that conventional electrolytic copper deposition methods employing compositions appropriate for damascene metallization (i.e., the composition comprises the three component superfilling additives including accelerator, suppressor, and leveler) are current density limited (such as about 0.10 A/dm$^2$ or less to get defect-free fill) and may require plating durations as long as 20 hours to completely metallize large dimension (e.g., greater than 50 micron diameter openings) through silicon via.

Available prior art in the field of through silicon via filling has not, to date, suggested methods and compositions capable of rapidly filling through silicon via in a commercially practicable deposition period.

For example, Arana et al. (U.S. 2007/0001266, Intel Corporation) disclose a method for filling through silicon via by incorporating particles into the copper metallization, the particles having a different coefficient of thermal expansion than the copper matrix. The stated purpose is to reduce stress variations between the copper metallization matrix and the silicon possibly caused by the differing bulk CTE of the respective materials. Notably, the reference does not include actual electrolytic copper plating chemistry, nor does the reference state that their electrolytic plating method incorporating particles in the deposition composition reduces through silicon via fill time.

Lane et al. (U.S. Pat. No. 7,081,408, Intel Corporation) disclose a method for filling through silicon via features. Although they discuss filling the through silicon via with copper metallization by any suitable process, for example, electrolytic deposition, Lane et al. do not disclose actual electrolytic copper plating chemistry, nor do they disclose the duration necessary to achieve copper filling.

Copper plating is also known from, e.g., also Eilert (U.S. Pat. No. 7,111,149); Rumer et al. (U.S. Pat. No. 6,924,551); Shi et al. (U.S. Pub. No. 2007/0085198); Ramanathan et al. (U.S. Pub. No. 2007/0117348) Heck et al. (U.S. Pub. No. 2006/0264029); Williams et al. (U.S. Pub. No. 2006/0273455); Rangel (U.S. Pub. No. 2006/0278979); and Savastiouk et al. (U.S. Pub. No. 2005/0136635). But none of these references, which relate to through silicon via architectures and methods, disclose applicable copper metallization chemistries or plating durations sufficient to fill through silicon via features.

Given the current state of the art, it is apparent that there is a distinct need for applicable methods and compositions sufficient for copper metallization of through silicon via features in a commercially practicable manner.

SUMMARY OF THE INVENTION

Briefly, therefore, the invention is directed to a method for metallizing a through silicon via feature in a semiconductor integrated circuit device substrate, wherein the semiconductor integrated circuit device substrate comprises a front surface, a back surface, and the via feature and wherein the via feature comprises an opening in the front surface of the substrate, a sidewall extending from the front surface of the substrate, and a bottom. The method comprises immersing the semiconductor integrated circuit device substrate into an electrolytic copper deposition composition, wherein the through silicon via feature has an entry dimension between 1 micrometers and 100 micrometers, a depth dimension between 20 micrometers and 750 micrometers, and an aspect ratio greater than about 2:1; and supplying electrical current to the electrolytic deposition composition to deposit copper metal onto the bottom and sidewall for bottom-up filling to thereby yield a copper filled via feature. The deposition composition comprises (a) a source of copper ions; (b) an acid selected from among an inorganic acid, organic sulfonic acid, and mixtures thereof; (c) an organic disulfide compound; (d) a compound selected from the group consisting of a reaction product of benzyl chloride and hydroxyethyl polyethyleneimine, a quaternized dipyridyl compound, and a combination thereof; and (d) chloride ions.

The invention is further directed to a composition for metallizing a through silicon via feature in a semiconductor integrated circuit device substrate. The composition comprises (a) a source of copper ions; (b) an acid selected from among an inorganic acid, organic sulfonic acid, and mixtures thereof; (c) an organic disulfide compound; (d) a compound selected from the group consisting of a reaction product of benzyl chloride and hydroxyethyl polyethyleneimine, a quaternized dipyridyl compound, and a combination thereof; and (d) chloride ions.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE EMBODIMENT(S) OF THE INVENTION

Figure 1:
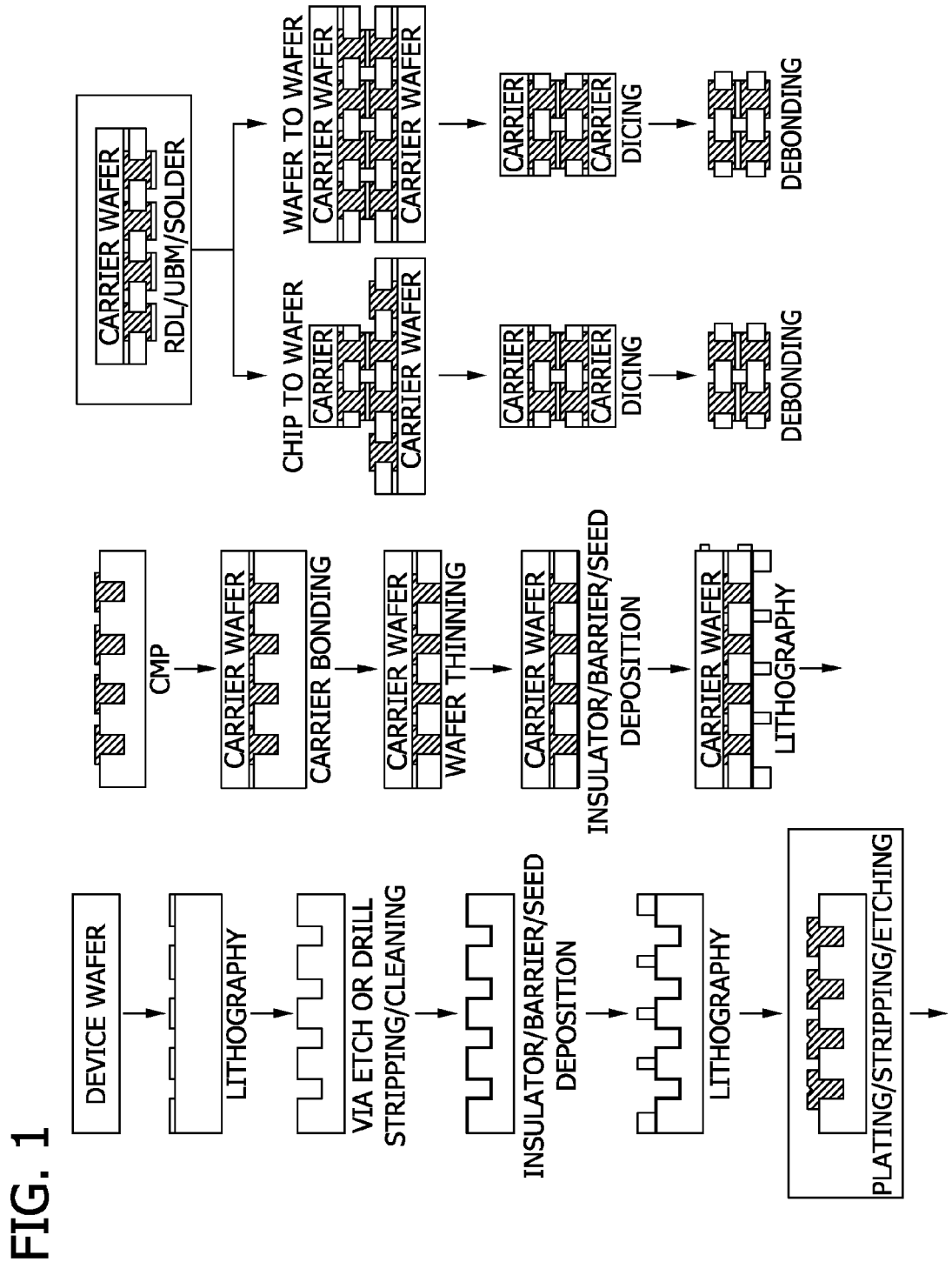
FIG. 1 is a flow chart of the through silicon via preparation process.

The present invention is directed to a method for metallizing through silicon via having a wide range of opening dimensions and aspect ratios. In particular, according to the method of the present invention, through silicon via are metallized with copper metallization. The present invention is further directed to a method for electrolytically depositing copper metal into through silicon via features located in semiconductor integrated circuit device substrates. In the context of semiconductor integrated circuit device manufacture, the semiconductor substrate may be, for example, a semiconductor wafer or chip. The semiconductor wafer is typically a silicon wafer or silicon chip, although other semiconductor materials, such as germanium, silicon germanium, silicon carbide, silicon germanium carbide, and gallium arsenide are applicable to the method of the present invention. The semiconductor substrate may be a semiconductor wafer or other bulk substrate that includes a layer of semiconductive material. The substrates include not only silicon wafers (e.g. monocrystalline silicon or polycrystalline silicon), but silicon on insulator ("SOI") substrates, silicon on sapphire ("SOS") substrates, silicon on glass ("SOG") substrates, epitaxial layers of silicon on a base semiconductor foundation, and other semiconductor materials, such as silicon-germanium, germanium, ruby, quartz, sapphire, gallium arsenide, diamond, silicon carbide, or indium phosphide.

The semiconductor substrate may have deposited thereon a dielectric (insulative) film, such as, for example, silicon oxide ($SiO_2$), silicon nitride ($SiN_x$), silicon oxynitride ($Si-O_xN_y$), carbon-doped silicon oxides, or low-κ dielectrics. Low-κ dielectric refers to a material having a smaller dielectric constant than silicon dioxide (dielectric constant=3.9), such as about 3.5, about 3, about 2.5, about 2.2, or even about 2.0. Low-κ dielectric materials are desirable since such materials exhibit reduced parasitic capacitance compared to the same thickness of $SiO_2$ dielectric, enabling increased feature density, faster switching speeds, and lower heat dissipation. Low-κ dielectric materials can be categorized by type (silicates, fluorosilicates and organo-silicates, organic polymeric etc.) and by deposition technique (CVD; spin-on). Dielectric constant reduction may be achieved by reducing polarizability, by reducing density, or by introducing porosity. The dielectric layer may be a silicon oxide layer, such as a layer of phosphorus silicate glass ("PSG"), borosilicate glass ("BSG"), borophosphosilicate glass ("BPSG"), fluorosilicate glass ("FSG"), or spin-on dielectric ("SOD"). The dielectric layer may be formed from silicon dioxide, silicon nitride, silicon oxynitride, BPSG, PSG, BSG, FSG, a polyimide, benzocyclobutene, mixtures thereof, or another nonconductive material as known in the art. In one embodiment, the dielectric layer is a sandwich structure of $SiO_2$ and SiN, as known in the art. The dielectric layer may have a thickness ranging from approximately 0.5 micrometers to 10 micrometers. The dielectric layer may be formed on the semiconductor substrate by conventional techniques.

The integrated circuit device substrates include patterned silicon wafer surfaces and patterned dielectric films. In some embodiments, these integrated circuit device substrates contain features that have substantially greater dimensions than sub-micron sized interconnect features that are conventionally metallized by the damascene method. In some embodiments, the substrates contain through silicon via features that have a depth from less than about 20 micrometers to about 750 micrometers, such as between about 20 micrometers and about 750 micrometers, typically between about 20 micrometers and about 500 micrometers, such as between about 50 micrometers and 250 micrometers or 300 micrometers. In some embodiments, the feature depths may range from about 20 micrometers to about 150 micrometers, such as between about 20 micrometers and about 100 micrometers, or between about 20 micrometers and about 50 micrometers. In some embodiments, these features have an entry dimension (i.e., the transverse distance between the two closest points on opposite sides of the feature opening, such as diameter where the entry is round or length when the entry is a generally rectangular trench) on the order of between about 200 nm and about 500 micrometers, such as between about 1 micrometer and about 300 micrometers, typically between about 5 micrometers and about 300 micrometers, such as between about 5 micrometers and about 100 micrometers or between about 10 micrometers and about 100 micrometers. In some embodiments, these features may have an entry dimension that is somewhat smaller, such as on the order of between about 1 micrometers and about 100 micrometers, such as between about 1 micrometers and about 50 micrometers, such as between about 1 micrometer and about 10 micrometers, such as between about 2 micrometers and about 10 micrometers, between about 3 micrometers and about 10 micrometers, between about 4 micrometers and about 10 micrometers, and between about 5 micrometers and about 10 micrometers. Aspect ratios may be greater than about 0.3:1, or greater than about 2:1. Aspect ratios may range from between about 0.3:1 to greater than about 20:1, such as between about 0.3:1 and about 20:1, such as between about 2:1 and about 20:1, such as between about 4:1 and about 15:1, such as about 2:1, 4:1, or 8:1.

According to the method of the present invention, through silicon via are metallized by electrolytic deposition employing electrolytic copper plating compositions. The electrolytic compositions include acid baths including inorganic acid baths, mixed organic acid baths, and alkaline baths. Exemplary electrolytic copper plating baths include copper fluoroborate, copper pyrophosphate, copper phosphonate, copper sulfate, and other copper metal complexes such as copper methane sulfonate. A preferred electrolytic copper plating composition comprises copper sulfate in sulfuric acid solution. Another preferred electrolytic copper plating composition comprises copper methane sulfonate in methane sulfonic acid solution.

In certain preferred embodiments of the invention, the copper source comprises copper sulfate, and the acid comprises sulfuric acid. The copper source comprising copper sulfate may comprise copper sulfate or any of its hydrates, typically copper sulfate hydrate and/or copper sulfate pentahydrate. The concentration of the copper source is generally sufficient to provide copper ion in a concentration from about 4 g/L copper ions to about 80 g/L copper ions. The source of sulfuric acid is typically concentrated sulfuric acid, but a dilute solution may be used. In general, the source of sulfuric acid is sufficient to provide from about 2 g/L sulfuric acid to about 225 g/L sulfuric acid in the copper plating solution. In this regard, suitable copper sulfate plating chemistries include high acid/low copper systems, low acid/high copper systems, and mid acid/high copper systems. In high acid/low copper systems, the copper ion concentration can be on the order of 4 g/L to on the order of 30 g/L; and the acid concentration may be sulfuric acid in an amount of greater than about 100 g/L up to about 225 g/L. In one high acid/low copper system, the copper ion concentration is about 17 g/L where the $H_2SO_4$ concentration is about 180 g/L. In some low acid/high copper systems, the copper ion concentration can be between about 35 g/L and about 85 g/L, such as between about 25 g/L and about 70 g/L. In some low acid/high copper systems, the copper ion concentration can be between about 46 g/L and about 60 g/L, such as between about 48 g/L and about 52 g/L. (35 g/L copper ion corresponds to about 140 g/L $CuSO_4.5H_2O$ copper sulfate pentahydrate.) The acid concentration in these systems is preferably less than about 100 g/L. In some low acid/high copper systems, the acid concentration can be between about 5 g/L and about 30 g/L, such as between about 10 g/L and about 15 g/L. In some low acid/high copper, the acid concentration can be between about 50 g/L and about 100 g/L, such as between about 75 g/L to about 85 g/L. In an exemplary low acid/high copper system, the copper ion concentration is about 40 g/L and the $H_2SO_4$ concentration is about 10 g/L. In another exemplary low acid/high copper system, the copper ion concentration is about 50 g/L and the $H_2SO_4$ concentration is about 80 g/L. In mid acid/high copper systems, the copper ion concentration can be on the order of 30 g/L to on the order of 60 g/L; and the acid concentration may be sulfuric acid in an amount of greater than about 50 g/L up to about 100 g/L. In one mid acid/high copper system, the copper ion concentration is about 50 g/L where the $H_2SO_4$ concentration is about 80 g/L.

Plating chemistries that employ copper sulfate/sulfuric acid are advantageous over plating chemistries that employ, e.g., copper methanesulfonate, in one respect since copper sulfate is generally a cheaper source of copper ions.

Experimental results to date indicate that chemistries that employ copper sulfate/sulfuric acid achieved better metallization results in terms of faster gapfill.

Another advantage of employing copper sulfate/sulfuric is the deposited copper contained very low impurity concentrations. In this regard, the copper metallization may contain elemental impurities, such as carbon, sulfur, oxygen, nitrogen, and chloride in ppm concentrations or less. For example, copper metallization has been achieved having carbon impurity at concentrations of less than about 50 ppm, less than 30 ppm, less than 20 ppm, or even less than 15 ppm. Copper metallization has been achieved having oxygen impurity at concentrations of less than about 50 ppm, less than 30 ppm, less than 20 ppm, less than 15 ppm, or even less than 10 ppm. Copper metallization has been achieved having nitrogen impurity at concentrations of less than about 10 ppm, less than 5 ppm, less than 2 ppm, less than 1 ppm, or even less than 0.5 ppm. Copper metallization has been achieved having chloride impurity at concentrations of less than about 10 ppm, less than 5 ppm, less than 2 ppm, less than 1 ppm, less than 0.5 ppm, or even less than 0.1 ppm. Copper metallization has been achieved having sulfur impurity at concentrations of less than about 10 ppm, less than 5 ppm, less than 2 ppm, less than 1 ppm, or even less than 0.5 ppm.

In some embodiments, the copper source comprises copper methanesulfonate, and the acid comprises methanesulfonic acid. The use of copper methanesulfonate as the copper source allows for greater concentrations of copper ions in the electrolytic copper deposition composition in comparison to other copper ion sources. Accordingly, the source of copper ion may be added to achieve copper ion concentrations greater than about 50 g/L, greater than about 90 g/L, or even greater than about 100 g/L, such as, for example about 110 g/L. Preferably, the copper methane sulfonate is added to achieve a copper ion concentration between about 70 g/L and about 100 g/L.

When copper methane sulfonate is used, it is preferred to use methane sulfonic acid and its derivative and other organic sulfonic acids as the electrolyte. When methane sulfonic acid is added, its concentration may be between about 1 g/L and about 50 g/L, such as between about 5 g/L and about 25 g/L, such as about 20 g/L.

High copper concentrations in the bulk solution contribute to a steep copper concentration gradient that enhances diffusion of copper into the features. Experimental evidence to date indicates that the copper concentration is optimally determined in view of the aspect ratio of the feature to be copper metallized. For example, in embodiments wherein the feature has a relatively low aspect ratio, such as about 3:1, about 2.5:1, or about 2:1 (depth:opening diameter), or less, the concentration of the copper ion is added and maintained at the higher end of the preferred concentration range, such as between about 90 g/L and about 110 g/L, such as about 110 g/L. In embodiments wherein the feature has a relatively high aspect ratio, such as about 4:1, about 5:1, or about 6:1 (depth:opening diameter), or more, the concentration of the copper ion may be added and maintained at the lower end of the preferred concentration range, such as between about 50 g/L and about 90 g/L, such as between about 50 g/L and 70 g/L. Without being bound to a particular theory, it is thought that higher concentrations of copper ion for use in metallizing high aspect ratio features may increase the possibility of necking (which may cause voids). Accordingly, in embodiments wherein the feature has a relatively high aspect ratio, the concentration of the copper ion is optimally decreased. Similarly, the copper concentration may be increased in embodiments wherein the feature a relatively low aspect ratio.

Chloride ion may also be used in the bath at a level up to about 200 mg/L (about 200 ppm), preferably about 10 mg/L to about 90 mg/L (10 to 90 ppm), such as about 50 gm/L (about 50 ppm). Chloride ion is added in these concentration ranges to enhance the function of other bath additives. In particular, it has been discovered that the addition of chloride ion enhances void-free filling.

The electrolytic copper plating compositions further comprise organic additives that enhance the bottom up fill and improve the fill rate. In a preferred embodiment, an additive is added that enhances the rate of copper deposition. This additive comprises an organic sulfur compound, such as organic disulfide compounds. Organic sulfur compounds that are currently preferred are water soluble organic divalent sulfur compounds. In one preferred embodiment, the organic sulfur compound has the following general structure (1):

Structure (1)

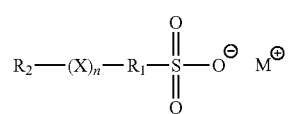

wherein

X is O, S, or S=O;

n is 1 to 6;

M is hydrogen, alkali metal, or ammonium as needed to satisfy the valence;

$R_1$ is an alkylene or cyclic alkylene group of 1 to 8 carbon atoms, an aromatic hydrocarbon or an aliphatic aromatic hydrocarbon of 6 to 12 carbon atoms; and $R_2$ is hydrogen, hydroxyalkyl having from 1 to 8 carbon atoms, or $MO_3SR_1$ wherein M and $R_1$ are as defined above.

In certain preferred embodiments, X is sulfur, and n is 2, such that the organic sulfur compound is an organic disulfide compound. Preferred organic sulfur compounds of Structure (1) have the following structure (2):

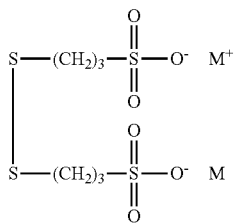

Structure (2)

wherein M is a counter ion possessing charge sufficient to balance the negative charges on the oxygen atoms. M may be, for example, protons, alkali metal ions such as sodium and potassium, or another charge balancing cation such as ammonium or a quaternary amine.

One example of the organic sulfur compound of structure (2) is the sodium salt of 3,3'-dithiobis(1-propanesulfonate), which has the following structure (3):

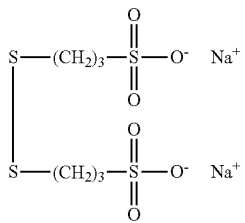

Structure (3)

An especially preferred example of the organic sulfur compound of structure (2) is 3,3'-dithiobis(1-propanesulfonic acid), which has the following structure (4):

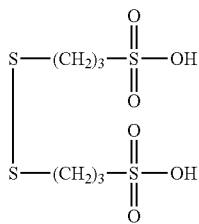

Structure (4)

Additional organic sulfur compounds that are applicable are shown by structures (5) through (16):

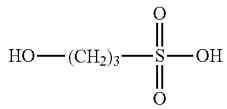

Structure (5)

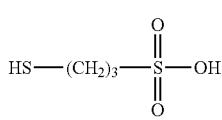

Structure (6)

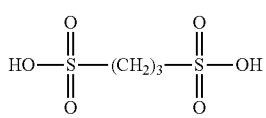

Structure (7)

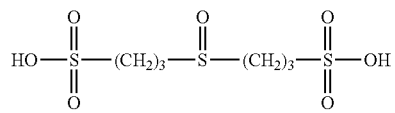

Structure (8)

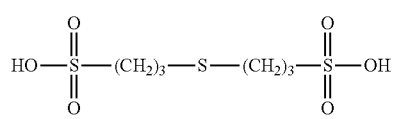

Structure (9)

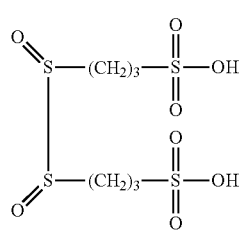

Structure (10)

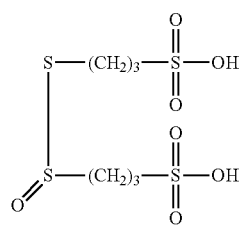

Structure (11)

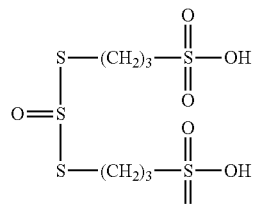

Structure (12a)

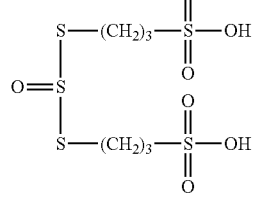

Structure (12b)

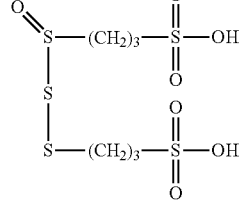

Structure (13)

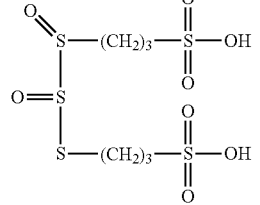

Structure (14)

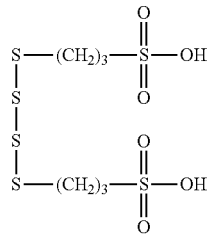

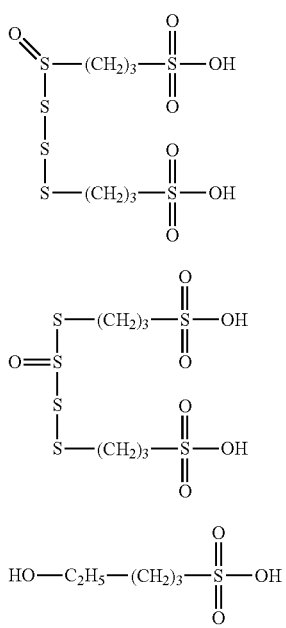

Structure (15a)

Structure (15b)

Structure (16)

The concentration of the organic sulfur compound may range from about 0.1 ppm to about 100 ppm, such as between about 0.5 ppm to about 20 ppm, preferably between about 1 ppm and about 6 ppm, more preferably between about 1 ppm and about 3 ppm, such as about 1.5 ppm.

The electrolytic copper plating compositions further comprise an additional organic additive comprising a polymeric material comprising nitrogen containing repeat units.

In one embodiment, the polymeric, nitrogen containing additive comprises a reaction product of benzyl chloride and hydroxyethyl polyethyleneimine. Such a material may be formed by reacting benzyl chloride with a hydroxyethyl polyethyleneimine that is available under the tradename Lupasol SC 61B from BASF Corporation of Rensselear, N.Y.). The hydroxyethyl polyethyleneimine has a molecular weight generally in the range of 50,000 to about 160,000.

In some embodiments, the additive comprises vinyl-pyridine based compounds. In one embodiment, the compound is a pyridinium compound and, in particular, a quaternized pyridinium salt. A pyridinium compound is a compound derived from pyridine in which the nitrogen atom of the pyridine is protonated. A quaternized pyridinium salt is distinct from pyridine, and quaternized pyridinium salt-based polymers are distinct from pyridine-based polymers, in that the nitrogen atom of the pyridine ring is quaternized in the quaternized pyridinium salt and quaternized pyridinium salt-based polymers. These compounds include derivatives of a vinyl pyridine, such as derivatives of 2-vinyl pyridine, 3-vinyl pyridine, and, in certain preferred embodiments, derivatives of 4-vinyl pyridine. The polymers of the invention encompass homo-polymers of vinyl pyridine, co-polymers of vinyl pyridine, quaternized salts of vinyl pyridine, and quaternized salts of these homo-polymers and co-polymers.

Some specific examples of quaternized poly(4-vinyl pyridine) include, for example, the reaction product of poly(4-vinyl pyridine) with dimethyl sulfate, the reaction product of 4-vinyl pyridine with 2-chloroethanol, the reaction product of 4-vinyl pyridine with benzylchloride, the reaction product of 4-vinyl pyridine with allyl chloride, the reaction product of 4-vinyl pyridine with 4-chloromethylpyridine, the reaction product of 4-vinyl pyridine with 1,3-propane sultone, the reaction product of 4-vinyl pyridine with methyl tosylate, the reaction product of 4-vinyl pyridine with chloroacetone, the reaction product of 4-vinyl pyridine with 2-methoxyethoxymethylchloride, and the reaction product of 4-vinyl pyridine with 2-chloroethylether.

Some examples of quaternized poly(2-vinyl pyridine) include, for example, the reaction product of 2-vinyl pyridine with methyl tosylate, the reaction product of 2-vinyl pyridine with dimethyl sulfate, the reaction product of vinyl pyridine and a water soluble initiator, poly(2-methyl-5-vinyl pyridine), and 1-methyl-4-vinylpyridinium trifluoromethyl sulfonate, among others.

An example of a co-polymer is vinyl pyridine co-polymerized with vinyl imidazole.

The molecular weight of the substituted pyridyl polymer compound additives of the invention in one embodiment is on the order of about 160,000 g/mol or less. While some higher molecular weight compounds are difficult to dissolve into the electroplating bath or to maintain in solution, other higher molecular weight compounds are soluble due to the added solubilizing ability of the quaternary nitrogen cation. The concept of solubility in this context is reference to relative solubility, such as, for example, greater than 60% soluble, or some other minimum solubility that is effective under the circumstances. It is not a reference to absolute solubility. The foregoing preference of 160,000 g/mol or less in certain embodiments is not narrowly critical. In one embodiment, the molecular weight of the substituted pyridyl polymer compound additive is about 150,000 g/mol, or less. Preferably, the molecular weight of the substituted pyridyl polymer compound additive is at least about 500 g/mol. Accordingly, the molecular weight of the substituted pyridyl polymer compound additive may be between about 500 g/mol and about 150,000 g/mol, such as about 700 g/mol, about 1000 g/mol, and about 10,000 g/mol. The substituted pyridyl polymers selected are soluble in the plating bath, retain their functionality under electrolytic conditions, and do not yield deleterious by-products under electrolytic conditions, at least neither immediately nor shortly thereafter.

In those embodiments where the compound is a reaction product of a vinyl pyridine or poly(vinyl pyridine), it is obtained by causing a vinyl pyridine or poly(vinyl pyridine) to react with an alkylating agent selected from among those which yield a product which is soluble, bath compatible, and effective for leveling. In one embodiment candidates are selected from among reaction products obtained by causing vinyl pyridine or poly(vinyl pyridine) to react with a compound of the following structure (17):

$R_1$-L
Structure (17)

wherein $R_1$ is alkyl, alkenyl, aralkyl, heteroarylalkyl, substituted alkyl, substituted alkenyl, substituted aralkyl, or substituted heteroarylalkyl; and L is a leaving group.

A leaving group is any group that can be displaced from a carbon atom. In general, weak bases are good leaving groups. Exemplary leaving groups are halides, methyl sulfate, tosylates, and the like.

In another embodiment, $R_1$ is alkyl or substituted alkyl; preferably, $R_1$ is substituted or unsubstituted methyl, ethyl, straight, branched or cyclic propyl, butyl, pentyl or hexyl; in one embodiment $R_1$ is methyl, hydroxyethyl, acetylmethyl, chloroethoxyethyl or methoxyethoxymethyl.

In a further embodiment, $R_1$ is alkenyl; preferably, $R_1$ is vinyl, propenyl, straight or branched butenyl, straight, branched or cyclic pentenyl or straight, branched, or cyclic hexenyl; in one embodiment $R_1$ is propenyl.

In yet another embodiment, $R_1$ is aralkyl or substituted aralkyl; preferably, $R_1$ is benzyl or substituted benzyl, naphthylalkyl or substituted naphthylalkyl; in one embodiment R1 is benzyl or naphthylmethyl.

In still another embodiment, $R_1$ is heteroarylalkyl or substituted heteroarylalkyl; preferably, $R_1$ is pyridylalkyl; particularly, $R_1$ is pyridylmethyl.

In a further embodiment, L is chloride, methyl sulfate ($CH_3SO_4^-$), octyl sulfate ($C_8H_{18}SO_4^-$), trifluoromethanesulfonate ($CF_3SO_3^-$), tosylate ($C_7H_7SO_3^-$), or chloroacetate ($CH_2ClC(O)O^-$); preferably, L is methyl sulfate, chloride or tosylate.

Water soluble initiators can be used to prepare polymers of vinyl pyridine, though they are not used in the currently preferred embodiments or in the working examples. Exemplary water soluble initiators are peroxides (e.g., hydrogen peroxide, benzoyl peroxide, peroxybenzoic acid, etc.) and the like, and water soluble azo initiators such as 4,4'-Azobis (4-cyanovaleric acid).

In a further embodiment, the compound constitutes a component of a mixture of one of the above-described polymers with a quantity of a monomer which is, for example, a monomeric vinyl pyridine derivative compound. In one such embodiment, the mixture is obtained by quaternizing a monomer to yield a quaternized salt which then undergoes spontaneous polymerization. The quaternized salt does not completely polymerize; rather, it yields a mixture of the monomer and spontaneously generated polymer.

The compound may be prepared by quaternizing 4-vinyl pyridine by reaction with dimethyl sulfate. Polymerization occurs according to the following reaction scheme (45-65° C.)

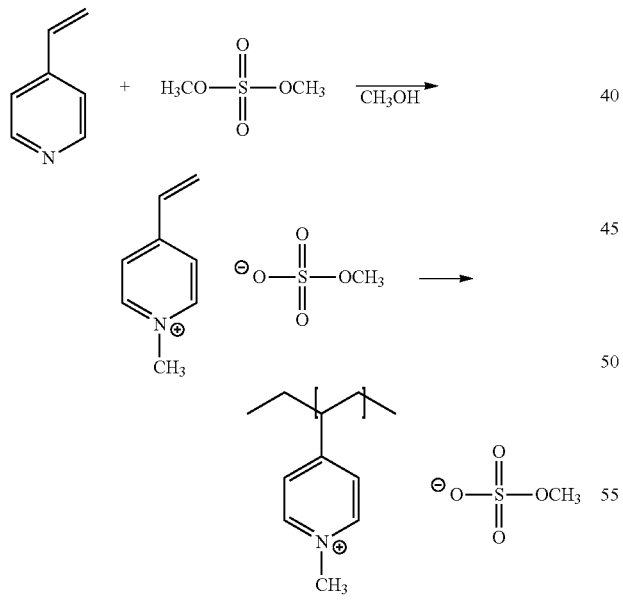

The average molecular weight of the polymer is generally less than 10,000 g/mol. The monomer fraction may be increased with an increase in amount of methanol used in the quaternization reaction; that is, the degree of spontaneous polymerization is decreased.

In some embodiments, the composition may comprise compounds comprising quaternized dipyridyls. In general, quaternized dipyridyls are derived from the reaction between a dipyridyl compound and an alkylating reagent. Although such a reaction scheme is a common method of quaternizing dipyridyls, the compounds are not limited to only those reaction products that are derived from the reaction between a dipyridyl compound and an alkylating reagent, but rather to any compound having the functionality described herein below.

Dipyridyls that may be quaternized to prepare the levelers of the present invention have the general structure (18):

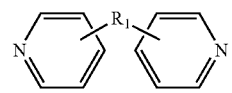

Structure (18)

wherein $R_1$ is a moiety that connects the pyridine rings. In Structure (18), each line from $R_1$ to one of the pyridine rings denotes a bond between an atom in the $R_1$ moiety and one of the five carbon atoms of the pyridine ring. In some embodiments, $R_1$ denotes a single bond wherein one carbon atom from one of the pyridine rings is directly bonded to one carbon atom from the other pyridine ring.

In some embodiments, the $R_1$ connection moiety may be an alkyl chain, and the dipyridyl may have the general structure (19):

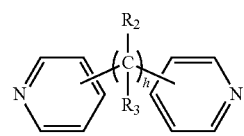

Structure (19)

wherein h is an integer from 0 to 6, and $R_2$ and $R_3$ are each independently selected from among hydrogen or a short alkyl chain having from 1 to about 3 carbon atoms. In Structure (19), each line from a carbon in the alkyl chain to one of the pyridine rings denotes a bond between a carbon atom in the alkyl chain and one of the five carbon atoms of the pyridine ring. In embodiments wherein h is 0, the connecting moiety is a single bond, and one carbon atom from one of the pyridine rings is directly bonded to one carbon atom from the other pyridine ring. In certain preferred embodiments, h is 2 or 3. In certain preferred embodiments, h is 2 or 3, and each $R_2$ and $R_3$ is hydrogen.

In some embodiments, the $R_1$ connecting moiety may contain a carbonyl, and the dipyridyl may have the general structure (20):

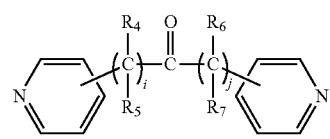

Structure (20)

wherein i and j are integers from 0 to 6, and $R_4$, $R_5$, $R_6$, and $R_6$ are each independently selected from among hydrogen or a short alkyl chain having from 1 to about 3 carbon atoms. In Structure (20), each line from a carbon in the connecting moiety to one of the pyridine rings denotes a bond between the carbon atom in the connecting moiety and one of the five carbon atoms of the pyridine ring. In embodiments wherein i and j are both 0, the carbon atom of the carbonyl is directly bonded to one carbon atom in each of the pyridine rings.

Two compounds in the general class of dipyridyls of structure (20), in which i and j are both 0, are 2,2'-dipyridyl ketone (structure (21)) and 4,4'-dipyridyl ketone (structure (22)), having the structures shown below:

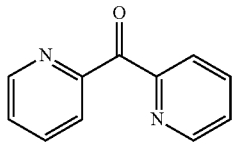

Structure (21)

2,2'-dipyridyl ketone

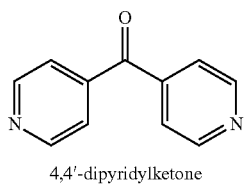

Structure (22)

4,4'-dipyridylketone

In some embodiments, the $R_1$ connecting moiety may contain an amine, and the dipyridyl may have the general structure (23):

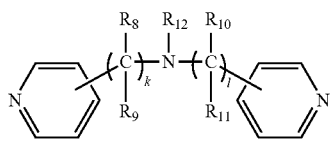

Structure (23)

wherein k and l are integers from 0 to 6, and $R_8$, $R_9$, $R_{10}$, $R_{11}$, and $R_{12}$ are each independently selected from among hydrogen or a short alkyl chain having from 1 to about 3 carbon atoms. In Structure (23), each line from a carbon in the connecting moiety to one of the pyridine rings denotes a bond between the carbon atom in the connecting moiety and one of the five carbon atoms of the pyridine ring. In embodiments wherein k and l are both 0, the nitrogen is directly bonded to one carbon atom in each of the pyridine rings.

One compound in the general class of dipyridyls of structure (23), in which k and l are both 0 and $R_{12}$ is hydrogen, is dipyridin-4-ylamine having the structure (24) shown below:

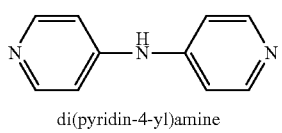

Structure (24)

di(pyridin-4-yl)amine

In some embodiments, the $R_1$ connecting moiety comprises another pyridine. Such a structure is actually a terpyridine having the general structure (25):

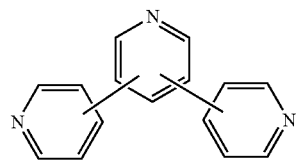

Structure (25)

In this structure, each line from each pyridine ring denotes a bond between one carbon on one ring and another carbon on another ring.

One such compound in the general class compounds of structure (25) is a terpyridine having the structure (26):

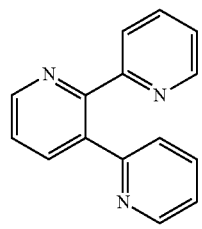

Structure (26)

terpyridine

Preferably, the dipyridyl is chosen from the general class of dipyridyls of general structure (19), and further in which $R_2$ and $R_3$ are each hydrogen. These dipyridyls have the general structure (27):

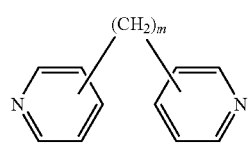

Structure (27)

wherein m is an integer from 0 to 6. In Structure (27), each line from a carbon atom in the alkyl chain to one of the pyridine rings denotes a bond between a carbon atom in the alkyl chain and one of the five carbon atoms of the pyridine ring. In embodiments wherein m is 0, the connecting moiety is a single bond, and one carbon atom from one of the pyridine rings is directly bonded to one carbon atom from the other pyridine ring. In certain preferred embodiments, m is 2 or 3.

Dipyridyls of the above general structure (27) include 2,2'-dipyridyl compounds, 3,3'-dipyridyl compounds, and 4,4'-dipyridyl compounds, as shown in the following structures (28), (29), and (30), respectively:

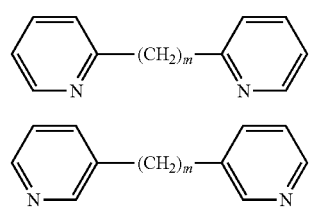

Structure (28)

Structure (29)

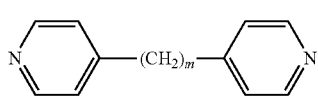

Structure (30)

wherein m is an integer from 0 to 6. When m is 0, the two pyridine rings are directly bonded to each other through a single bond. In preferred embodiments, m is 2 or 3.

2,2'-dipyridyl compounds include 2,2'-dipyridyl, 2,2'-ethylenedipyridine (1,2-Bis(2-pyridyl)ethane), Bis(2-pyridyl)methane, 1,3-Bis(2-pyridyl)propane, 1,4-Bis(2-pyridyl)butane, 1,5-Bis(2-pyridyl)pentane, and 1,6-Bis(2-pyridyl)hexane.

3,3'-dipyridyl compounds include 3,3'-dipyridyl, 3,3'-ethylenedipyridine (1,2-Bis(3-pyridyl)ethane), Bis(3-pyridyl)methane, 1,3-Bis(3-pyridyl)propane, 1,4-Bis(3-pyridyl)butane, 1,5-Bis(3-pyridyl)pentane, and 1,6-Bis(3-pyridyl)hexane.

4,4'-dipyridyl compounds include, for example, 4,4'-dipyridyl, 4,4'-ethylenedipyridine (1,2-Bis(4-pyridyl)ethane), Bis(4-pyridyl)methane, 1,3-Bis(4-pyridyl)propane, 1,4-Bis(4-pyridyl)butane, 1,5-Bis(4-pyridyl)pentane, and 1,6-Bis(4-pyridyl)hexane.

Of these dipyridyl compounds, 4,4'-dipyridyl compounds are preferred since compounds based on 4,4'-dipyridyl have been found to be particularly advantageous levelers in terms of achieving low impurity inclusion and underplate and overplate reduction. In particular, 4,4'-dipyridyl, having the structure (31), 4,4'-ethylenedipyridine, having structure (32), and 1,3-Bis(4-pyridyl)propane having structure (33) are more preferred. Compounds based on the dipyridyls of structure (32) and (33) are currently the most preferred levelers.

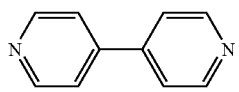

Structure (31)

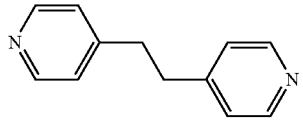

Structure (32)

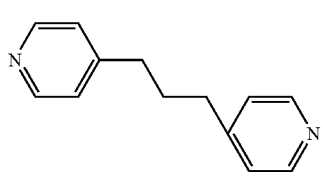

Structure (33)

These compounds are quaternized dipyridyl compounds, typically prepared by alkylating at least one and preferably both of the nitrogen atoms. Alkylation occurs by reacting the above-described dipyridyl compounds with an alkylating agent. In some embodiments, the alkylating agent may be of a type particularly suitable for forming polymers. In some embodiments, the alkylating agent is of a type that reacts with the dipyridyl compound but does not form polymers.

Alkylating agents that are suitable for reacting with dipyridyl compounds that generally form non-polymeric levelers may have the general structure (34):

Structure (34)

wherein

A may be selected from among hydrogen, hydroxyl (—OH), alkoxy (—OR$_1$), amine (—NR$_2$R$_3$R$_4$),

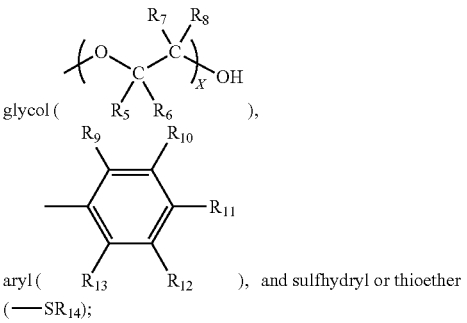

glycol ( ), aryl ( ), and sulfhydryl or thioether (—SR$_{14}$);

o is an integer between one and six, preferably one or two; and

X is an integer from one to about four, preferably one or two; and

Y is a leaving group. The leaving group may be selected from among, for example, chloride, bromide, iodide, tosyl, triflate, sulfonate, mesylate, dimethyl sulfonate, fluorosulfonate, methyl tosylate, brosylate, or nosylate.

In each A group above, the single line emanating from the functional moiety denotes a bond between an atom in the A moiety, e.g., oxygen, nitrogen, or carbon, and a carbon of the —(CH$_2$)$_o$— alkylene group. Additionally, the R$_1$ through R$_{14}$ groups denoted in the A moieties of Structure (34) are independently hydrogen; substituted or unsubstituted alkyl having from one to six carbon atoms, preferably one to three carbon atoms; substituted or unsubstituted alkylene having from one to six carbon atoms, preferably from one to three carbon atoms; or substituted or unsubstituted aryl. The alkyl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters and ethers. In general, the various alkyl R groups are hydrogen or unsubstituted alkyl.

With regard to the aryl group, any of the R$_6$ through R$_{10}$ carbons, together with an adjacent R group and the carbons to which they are bonded may form an aryl group, i.e., the aryl group comprises a fused ring structure, such as a naphthyl group.

Exemplary A groups include:

hydrogen, hydroxyl (—OH), methoxy (—OCH$_3$), ethoxy (—OCH$_2$CH$_3$),

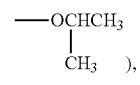

amino (—NH$_2$), methylamino (—NHCH$_3$), dimethylamino (—N(CH$_3$)—CH$_3$), ethylene glycol (—O—CH$_2$CH$_2$—OH), diethylene glycol (—(O—CH$_2$CH$_2$)$_2$—OH), -continued propylene glycol (—OCH₂CH₂CH₂—OH or

—OCHCH₂—OH
   |
   CH₃      ), dipropylene glycol (—(OCH₂CH₂CH₂)₂—OH or

—(OCHCH₂)₂—OH
    |
    CH₃      ), phenyl ( 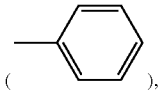 ), naphthenyl ( 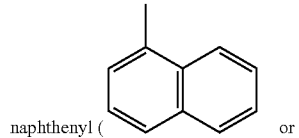 or

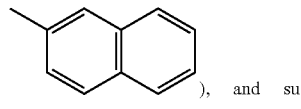 ), and sulfhydryl (—SH), or derivatives of each of these.

Preferably, A is selected from among:

hydrogen, hydroxyl (—OH), methoxy (—OCH₃), ethoxy (—OCH₂CH₃), propoxy (—OCH₂CH₂CH₃ or —OCHCH₃
                                |
                                CH₃ ), ethylene glycol (—O—CH₂CH₂—OH), diethylene glycol (—(O—CH₂CH₂)₂—OH), propylene glycol (—OCH₂CH₂CH₂OH or —OCHCH₂—OH
   |
   CH₃      ) phenyl ( 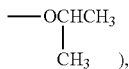 ), and naphthenyl ( 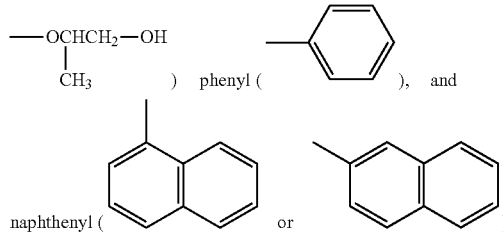 or  ), or derivatives of each of these.

More preferably, A is selected from among:

hydroxyl (—OH), ethylene glycol (—O—CH₂CH₂—OH), propylene glycol (—OCH₂CH₂CH₂OH or —OCHCH₂OH
   |
   CH₃      ), and phenyl (  ), or derivatives of each of these.

Preferably, in the alkylating agents of Structure (34), o is one or two, and Y is chloride.

Alkylating agents that react with the dipyridyl compounds and generally form polymeric compounds may have the general structure (35):

Y—(CH₂)$_p$—B—(CH₂)$_q$—Z                 Structure (35)

wherein
B may be selected from among:

a single bond, an oxygen atom (—O—),

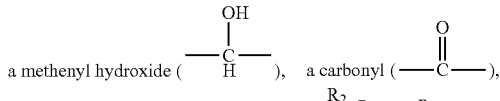

a methenyl hydroxide ( ), a carbonyl ( ),

an amino (—N—), an imino ( ), a sulfur atom (—S—), a sulfoxide (—S—),
                                  ‖
                                  O

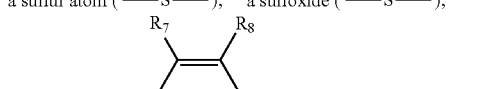

a phenylene ( ), and

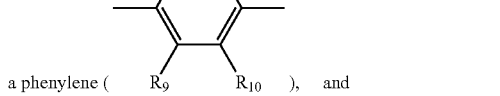

a glycol ( );

and
p and q may be the same or different, are integers between 0 and 6, preferably from 0 to 2, wherein at least one of p and q is at least 1;

X is an integer from one to about four, preferably one or two; and

Y and Z are leaving groups. The leaving group may be selected from among, for example, chloride, bromide, iodide, tosyl, triflate, sulfonate, mesylate, methosulfate, fluorosulfonate, methyl tosylate, brosylate, or nosylate.

In each B group above, the single line emanating from the functional moiety denotes a bond between an atom in the B moiety, e.g., oxygen, nitrogen, or carbon, and a carbon of the —(CH₂)$_p$— and —(CH₂)$_q$— alkylene groups. Additionally, the R₁ through R₁₄ groups in denoted in the B moieties of Structure (35) are independently hydrogen; substituted or unsubstituted alkyl having from one to six carbon atoms, preferably one to three carbon atoms; substituted or unsubstituted alkylene having from one to six carbon atoms, preferably from one to three carbon atoms; or substituted or unsubstituted aryl. The alkyl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters and ethers. In general, the various R groups are hydrogen or unsubstituted alkyl, and even more preferably, the R groups are hydrogen.

Preferably, B is selected from among:

an oxygen atom (—O—), a methenyl hydroxide ( 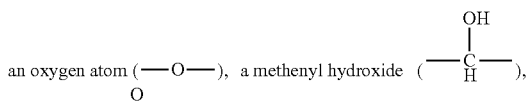 ), a carbonyl (  ), a phenylene group ( 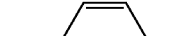 ), an ethylene glycol group ( 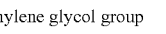 ), and a propylene glycol group ( 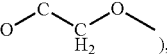 ).

More preferably, B is selected from among:

an oxygen atom ( —O— ), a methenyl hydroxide ( 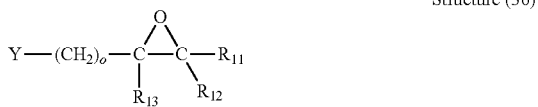 ), a carbonyl ( —C(=O)— ), a phenylene group ( 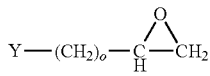 ), and an ethylene glycol group ( 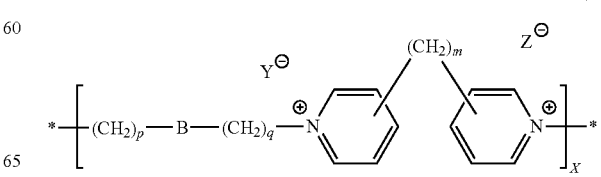 ).

Preferably, in the alkylating agents of Structure (35), p and q are both one or are both two, and Y and Z are both chloride.

Another class of alkylating agents that may form a polymeric leveler when reacted with the dipyridyl compounds includes an oxirane ring and has the general structure (36):

Structure (36)

Y—(CH$_2$)$_o$—C(R$_{13}$)—C(R$_{12}$)(R$_{11}$) [with epoxide O]

wherein

R$_{11}$, R$_{12}$, and R$_{13}$ are hydrogen or substituted or unsubstituted alkyl having from one to six carbon atoms, preferably from one to three carbon atoms;

o is an integer between one and six, preferably one or two; and

Y is a leaving group. The leaving group may be selected from among, for example, chloride, bromide, iodide, tosyl, triflate, sulfonate, mesylate, methosulfate, fluorosulfonate, methyl tosylate, brosylate, or nosylate.

Preferably, R$_{11}$, R$_{12}$, and R$_{13}$ are hydrogen and the alkylating agent has the following general structure (37):

Structure (37)

Y—(CH$_2$)$_o$—CH—CH$_2$ [with epoxide O]

wherein o and Y are as defined in connection with Structure (36).

Preferably, o is one, Y is chloride, and the alkylating agent of general Structure (36) is epichlorohydrin.

The reaction product causes the leaving group to form an anion in the reaction mixture. Since chloride is commonly added to electrolytic copper plating compositions, Y and Z are preferably chloride. While the other leaving groups may be used to form the leveling compounds of the present invention, these are less preferred since they may adversely affect the electrolytic plating composition. Leveling agents that are charge balanced with, for example, bromide or iodide, are preferably ion exchanged with chloride prior to adding the leveling compound to the electrolytic copper plating compositions of the present invention.

Specific alkylating agents of the above structure (34) include, for example, 2-chloroethylether, benzyl chloride, 2-(2-chloroethoxy)ethanol, chloroethanol, 1-(chloromethyl)-4-vinylbenzene, and 1-(chloromethyl)naphthalene.

Specific alkylating agents of the above structure (35) include, for example, 1-chloro-2-(2-chloroethoxy)ethane, 1,2-bis(2-chloroethoxy)ethane, 1,3-dichloropropan-2-one, 1,3-dichloropropan-2-ol, 1,2-dichloroethane, 1,3-dichloropropane, 1,4-dichlorobutane, 1,5-dichloropentane, 1,6-dichlorohexane, 1,7-dichloroheptane, 1,8-dichlorooctane, 1,2-di(2-chloroethyl)ether, 1,4-bis(chloromethyl)benzene, m-di(chloromethyl)benzene, and o-di(chloromethyl)benzene.

A specific alkylating agent of the above structure (36) is epichlorohydrin. The alkylating agents may comprise bromide, iodide, tosyl, triflate, sulfonate, mesylate, dimethyl sulfonate, fluorosulfonate, methyl tosylate, brosylate, or nosylate derivatives of the above chlorinated alkylating agents, but these are less preferred since chloride ion is typically added to electrolytic copper plating compositions, and the other anions may interfere with copper deposition.

A wide variety of leveler compounds may be prepared from the reaction of the dipyridyl compounds having the structures (18) through (33) and the alkylating agents having the general structures (34) through (37). Reactions to prepare the leveler compounds may occur according to the conditions described in Nagase et al., U.S. Pat. No. 5,616,317, the entire disclosure of which is hereby incorporated as if set forth in its entirety. In the reaction, the leaving groups are displaced when the nitrogen atoms on the pyridyl rings react with and bond to the methylene groups in the dihalogen compound. Preferably, the reaction occurs in a compatible organic solvent, preferably having a high boiling point, such as ethylene glycol or propylene glycol.

In some embodiments, the leveler compounds of the present invention are polymers, and the levelers may be prepared by selecting reaction conditions, i.e., temperature, concentration, and the alkylating agent such that the dipyridyl compound and alkylating agent polymerize, wherein the repeat units of the polymer comprise one moiety derived from the dipyridyl compound and one moiety derived from the alkylating. In some embodiments, the dipyridyl compound has the structure (27) and the alkylating agent has the general structure depicted above in Structure (35). In some embodiments, therefore, the leveler compound is a polymer comprising the following general structure (38):

Structure (38)

*—[(CH$_2$)$_p$—B—(CH$_2$)$_q$—N$^+$(pyridyl)—(CH$_2$)$_m$—N$^+$(pyridyl)—]$_x$—*   Y$^-$  Z$^-$ wherein B, m, p, q, Y, and Z are as defined with regard to structures (27) and (35), and X is an integer that is at least 2. Preferably, X ranges from 2 to about 100, such as from about 2 to about 50, from about 2 to about 25, and even more preferably from about 4 to about 20.

As stated above, preferred dipyridyl compounds are based on 4,4'-dipyridyl compounds. In some preferred embodiments, the leveler compound is a reaction product of 4,4'-dipyridyl of structure (31) and an alkylating agent of structure (35). Reaction conditions, i.e., temperatures, relative concentrations, and choice of alkylating agent may be selected such that 4,4'-dipyridyl and the alkylating agent polymerize, wherein the repeat units of the polymer comprise one moiety derived from 4,4'-dipyridyl and one moiety derived from the alkylating agent. In some embodiments, therefore, the leveler compound is a polymer comprising the following general structure (39):

Structure (39)

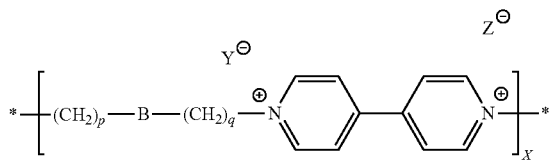

wherein B, p, q, Y, and Z are as defined with regard to structure (35), and X is an integer of at least 2, preferably from 2 to 100, such as from 2 to 50, and more preferred from 3 to about 20.

One particular leveler compound in the class of levelers of structure (39) is the reaction product of the 4,4'-dipyridyl and an alkylating agent wherein B is the oxygen atom, p and q are both 2, and Y and Z are both chloride, i.e., 1-chloro-2-(2-chloroethoxy)ethane. This leveler compound is a polymer comprising the following structure (40):

Structure (40)

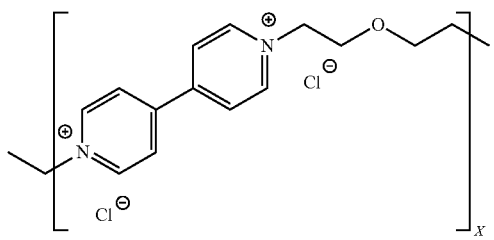

wherein X is an integer of at least 2, preferably from 2 to 100, such as from 2 to 50, and more preferred from 3 to about 20.

In some preferred embodiments, the leveler compound is a reaction product of 4,4'-dipyridyl of structure (32) and an alkylating agent of structure (35). Reaction conditions, i.e., temperatures, relative concentrations, and choice of alkylating agent may be selected such that 4,4'-ethylenedipyridine and the alkylating agent polymerize, wherein the repeat units of the polymer comprise one moiety derived from 4,4'-ethylenedipyridine and one moiety derived from the alkylating agent. In some embodiments, therefore, the leveler compound is a polymer comprising the following general structure (41):

Structure (41)

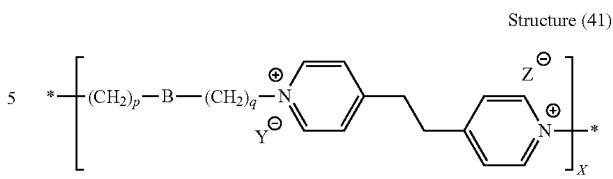

wherein B, p, q, Y, and Z are as defined with regard to structure (35) and X is an integer of at least 2, preferably from 2 to 100, such as from 2 to 50, and more preferred from 3 to about 20.

One particular leveler compound in the class of levelers of structure (41) is polymer that may be prepared from reacting 4,4'-ethylenedipyridine and an alkylating agent wherein B is the oxygen atom, p and q are both 2, and Y and Z are both chloride, i.e., 1-chloro-2-(2-chloroethoxy)ethane. This leveler compound is a polymer comprising the following structure (42):

Structure (42)

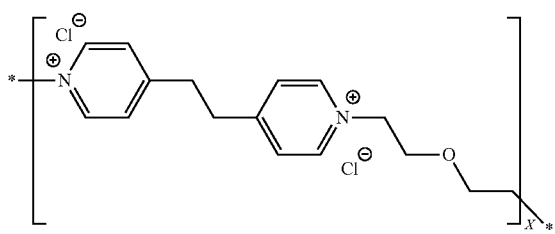

wherein X is an integer of at least 2, preferably from 2 to 100, such as from 2 to 50, and more preferred from 3 to about 20. In one preferred leveler of structure (42), X is an average value from about 3 to about 12, such as between about 4 and about 8, or even about 5 to about 6. In one preferred leveler of structure (42), X is an average value from about 10 to about 24, such as between about 12 to about 18, or even about 13 to about 14.

Another leveler compound in the class of levelers of structure (41) is a polymer that may be prepared by reacting 4,4'-ethylenedipyridine and an alkylating agent wherein B is the ethylene glycol, p and q are both 2, and Y and Z are both chloride, i.e., 1,2-bis(2-chloroethoxy)ethane. This leveler compound is a polymer comprising the following structure (43):

Structure (43)

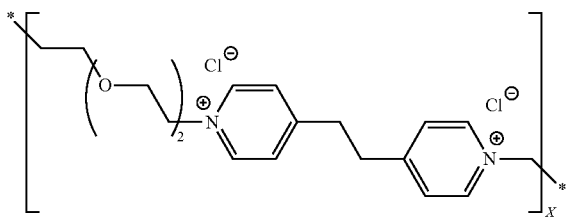

wherein X is an integer of at least 2, preferably from 2 to 100, such as from 2 to 50, and more preferred from 3 to about 20.

Another leveler compound in the class of levelers of structure (41) is a polymer that may be prepared by reacting 4,4'-ethylenedipyridine and an alkylating agent wherein B is the carbonyl, p and q are both 1, and Y and Z are both chloride, i.e., 1,3-dichloropropan-2-one. This leveler compound is a polymer comprising the following structure (44):

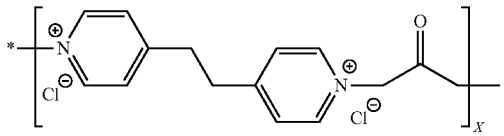

Structure (44)

wherein X is an integer of at least 2, preferably from 2 to 100, such as from 2 to 50, and more preferred from 3 to about 20.

Another leveler compound in the class of levelers of structure (41) is a polymer that may be prepared by reacting 4,4'-ethylenedipyridine and an alkylating agent wherein B is the methenyl hydroxide, p and q are both 1, and Y and Z are both chloride, i.e., 1,3-dichloropropan-2-ol. This leveler compound is a polymer comprising the following structure (45):

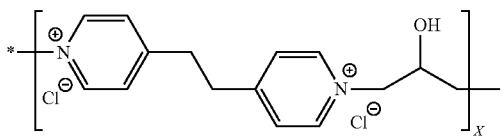

Structure (45)

wherein X is an integer of at least 2, preferably from 2 to 100, such as from 2 to 50, and more preferred from 3 to about 20.

Another leveler compound in the class of levelers of structure (41) is a polymer that may be prepared by reacting 4,4'-ethylenedipyridine and an alkylating agent wherein B is the phenylene, p and q are both 1, and Y and Z are both chloride, i.e., 1,4-bis(chloromethyl)benzene. This leveler compound is a polymer comprising the following structure (46):

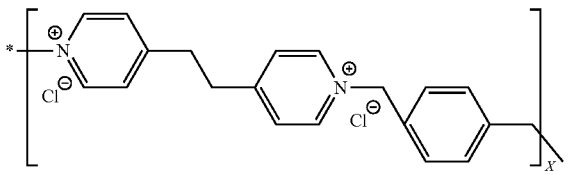

Structure (46)

wherein X is an integer of at least 2, preferably from 2 to 100, such as from 2 to 50, and more preferred from 3 to about 20.

In some preferred embodiments, the leveler compound is a reaction product of 4,4'-dipyridyl of structure (33) and an alkylating agent of structure (35). Reaction conditions, i.e., temperatures, relative concentrations, and choice of alkylating agent may be selected such that 1,3-di(pyridin-4-yl)propane and the alkylating agent polymerize, wherein the repeat units of the polymer comprise one moiety derived from 1,3-di(pyridin-4-yl)propane and one moiety derived from the alkylating agent. In some embodiments, therefore, the leveler compound is a polymer comprising the following general structure (47):

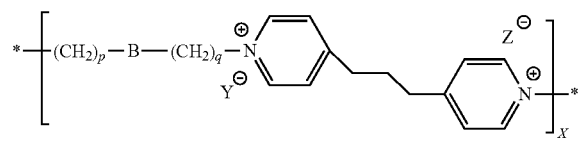

Structure (47)

wherein B, p, q, Y, and Z are as defined with regard to structure (35) and X is an integer of at least 2, preferably from 2 to 100, such as from 2 to 50, and more preferred from 3 to about 20.

One particular leveler compound in the class of levelers of structure (47) is polymer that may be prepared from reacting 1,3-di(pyridin-4-yl)propane and an alkylating agent wherein B is the oxygen atom, p and q are both 2, and Y and Z are both chloride, i.e., 1-chloro-2-(2-chloroethoxy)ethane. This leveler compound is a polymer comprising the following structure (48):

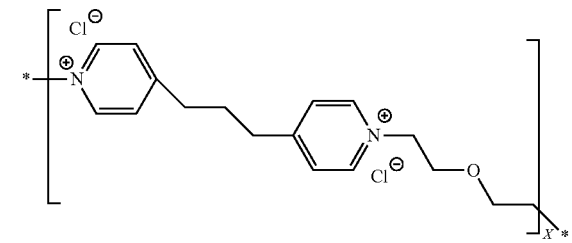

Structure (48)

wherein X is an integer of at least 2, preferably from 2 to 100, such as from 2 to 50, and more preferred from 3 to about 20, such as from about 4 to about 8, or from about 12 to about 16. In one preferred leveler of structure (48), X is an average value from about 5 to about 6. In one preferred leveler of structure (48), X is an average value from about 13 to about 14.

In some embodiments, the leveler compounds may be prepared by reacting a dipyridyl compound having the structure (27) and an alkylating agent having the general structure depicted above in Structure (35) in a manner that does not form a polymeric leveler. That is, the levelers may be prepared by selecting reaction conditions, i.e., temperature, concentration, in which the alkylating agent such that the dipyridyl compound and alkylating agent react but do not polymerize. The leveler compound may comprise the following structure (49):

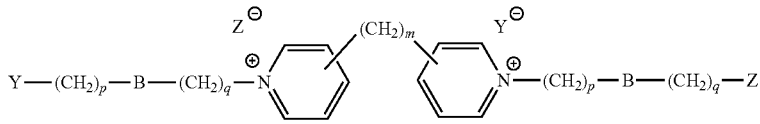

Structure (49)

wherein B, m, p, q, Y, and Z are as defined with regard to structures (27) and (35).

As stated above, preferred dipyridyl compounds have general structure (27) such that preferred levelers are based on 4,4'-dipyridyl compounds. In some preferred embodiments, the leveler compound is a reaction product of 4,4'-dipyridyl of structure (31) and an alkylating agent of structure (35) and may comprise the following structure (50):

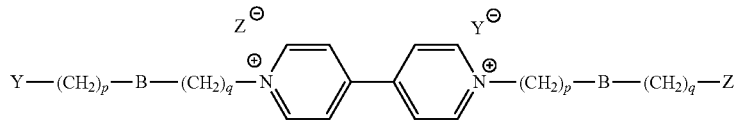

Structure (50)

wherein B, p, q, Y, and Z are as defined with regard to Structure (35).

One particular leveler compound in the class of levelers of structure (50) is the reaction product of the 4,4'-dipyridyl and an alkylating agent wherein B is the oxygen atom, p and q are both 2, and Y and Z are both chloride, i.e., 1-chloro-2-(2-chloroethoxy)ethane. This leveler compound may comprise the following structure (51):

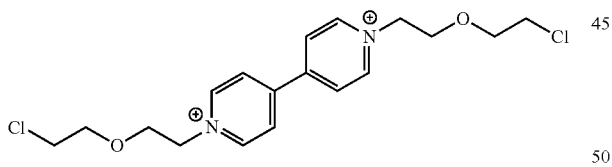

Structure (51)

In some preferred embodiments, the leveler compound is a reaction product of 4,4'-dipyridyl of structure (32) and an alkylating agent of structure (35). In some embodiments, therefore, the leveler compound may comprise the following structure (52):

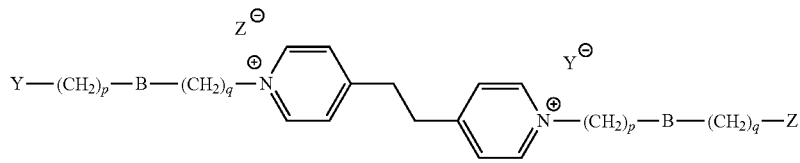

Structure (52)

wherein B, p, q, Y, and Z are as defined with regard to structure (35).

One particular leveler compound in the class of levelers of structure (52) is the reaction product of the 4,4'-ethylenedipyridine and an alkylating agent wherein B is the oxygen atom, p and q are both 2, and Y and Z are both chloride, i.e., 1-chloro-2-(2-chloroethoxy)ethane. This leveler compound may comprise the following structure (53):

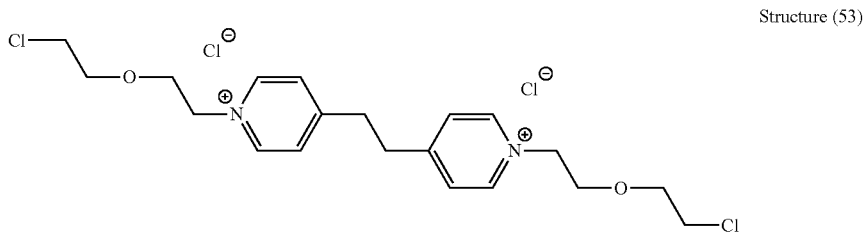 [SMILES: ClCCOCC[n+]1ccc(CCc2cc[n+](CCOCCCl)cc2)cc1 ; [Cl-] ; [Cl-]]

Structure (53)

Another leveler compound in the class of levelers of structure (52) is a polymer that may be prepared by reacting 4,4'-ethylenedipyridine and an alkylating agent wherein B is the ethylene glycol, p and q are both 2, and Y and Z are both chloride, i.e., 1,2-bis(2-chloroethoxy)ethane. This leveler compound may comprise the following structure (54):

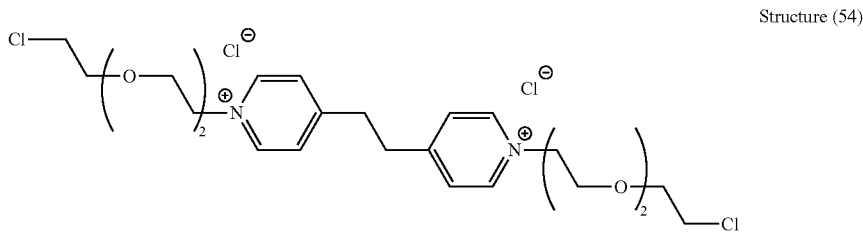

Structure (54)

In some embodiments, the leveler compound may be prepared by reacting a dipyridyl molecule having the structure (27) and an alkylating agent having the general structure depicted above in structure (34). This leveler compound may comprise the following structure (55):

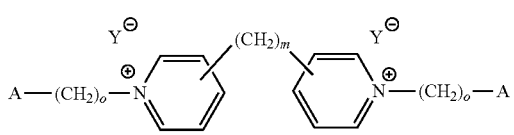

Structure (55)

wherein A, m, o, and Y are as defined with regard to structures (27) and (34).

In some preferred embodiments, the leveler compound is a reaction product of 4,4'-dipyridyl of structure (32) and an alkylating agent of structure (34). In some embodiments, therefore, the leveler compound may comprise the following structure (56):

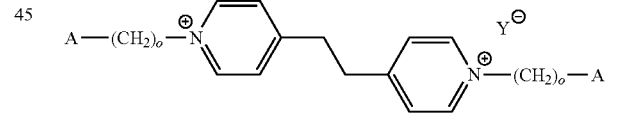

Structure (56)

wherein A, o, and Y are as defined with regard to structure (34).

One particular leveler compound in the class of levelers of structure (56) is the reaction product of the 4,4'-ethylenedipyridine and an alkylating agent wherein A is the phenyl group, o is 1, and Y is chloride, i.e., benzyl chloride. This leveler compound may comprise the following structure (57):

Structure (57)

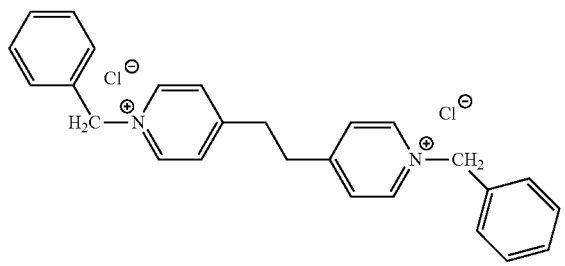

The leveler concentration may range from about 1 ppm to about 100 ppm, such as between about 2 ppm to about 50 ppm, preferably between about 2 ppm and about 20 ppm, more preferably between about 2 ppm and about 10 ppm, such as between about 5 ppm and about 10 ppm.

The composition may additionally comprise a compound comprising polyether chains. The polyether chains generally comprising alkylene oxide repeat units, most typically ethylene oxide (EO) repeat units, propylene oxide (PO) repeat units, or combinations thereof. In those polymeric chains comprising both EO and PO repeat units, the repeat units may be arranged in random, alternating, or block configurations. The polymeric chains comprising alkylene oxide repeat units may contain residues derived from initiating moiety used to initiate the polymerization reaction. Compounds applicable for use in this invention include polypropylene glycol amine (PPGA), in particular, poly(propylene glycol)bis(2-aminopropyl ether) (400 g/mol) and low molecular weight polypropylene glycol (PPG).

Additional compounds include EO and PO polyether polymers comprising a glycerin residue. Exemplary compounds are described in Too et al., U.S. Pat. No. 6,776,893, the disclosure of which is incorporated by reference as if set forth in its entirety. One such compound is a propoxylated glycerin having a molecular weight of about 700 g/mol. Another such compound is a EO/PO on glycerin having molecular weight of about 2500 g/mol. Yet another example comprises an EO/PO polyether chain comprising a naphthyl residue, wherein the polyether chain is terminated with a sulfonate moiety. Such a material is available under the trade name Ralufon NAPE 14-90, available from Raschig.

The polyether polymer compound concentration may range from about 1 ppm to about 1000 ppm, such as between about 5 ppm to about 200 ppm, preferably between about 10 ppm and about 100 ppm, more preferably between about 10 ppm and about 50 ppm, such as between about 10 ppm and about 20 ppm.

FIG. 1 is a flow chart of the process steps in preparing a wafer-to-wafer stack or chip-to-wafer stack involving through silicon via metallization. The wafer substrate (i.e., device wafer) for metallization using the electrolytic copper deposition solution of the present invention comprises a back surface, a front surface, and vias and through silicon vias, which are prepared by photolithography and etching methods as is conventionally known. In the context of the present invention, the front surface refers to the active side of the device wafer substrate. Accordingly, vias and through silicon vias have openings that extend from the front surface of the wafer substrate to a depth defined by the length of their sidewalls. In a typical process, conventional photoresist material is applied to a cleaned and dried surface of a device wafer by spin coating. The photoresist may be soft-baked to remove excess solvent at a temperature between about 60° C. and about 100° C. for about 5 to 30 minutes. After soft-baking, the photoresist is exposed to ultraviolet light in a manner that defines the pattern of copper metallization. Exposed photoresist is then dissolved using a developer solution. The wafer and photoresist defining the copper metallization pattern is then hard-baked, typically between about 120° C. and about 180° C. for about 20 to 30 minutes. The exposed wafer is then etched by means known in the art to define a pattern of vias having sidewalls and bottoms. The front surface of the wafer substrate and the sidewalls and the bottoms of the vias (including through silicon vias) are then coated with a barrier layer, which may be titanium nitride, tantalum, tantalum nitride, or ruthenium to inhibit copper diffusion. Next, the barrier layer is typically seeded with a seed layer of copper or other metal to initiate copper superfilling plating thereon. A copper seed layer may be applied by chemical vapor deposition (CVD), physical vapor deposition (PVD), or the like. The vias having barrier layers and copper seed layers are then plated using the electrolytic copper deposition composition and method of the present invention. Prior to metallization, the wafer surface having TSV features therein may optionally be pretreated to ensure proper wetting of the vias with the Cu filling chemistry. An exemplary solution useful for degassing the wafer surface if MICROFAB® PW 1000, available from Enthone Inc. (West Haven, Conn.). After degassing, TSV features located in the wafer is copper metallized using the electrolytic copper deposition composition of the present invention.

As a general proposition, the plating equipment is not critical to the invention. In one preferred arrangement, a cathode substrate and anode are electrically connected by wiring and, respectively, to a rectifier (power supply). The cathode substrate for direct or pulse current has a net negative charge so that copper ions in the solution are reduced at the cathode substrate forming plated copper metal on the cathode surface. An oxidation reaction takes place at the anode. This same oxidation reaction may take place at the cathode if periodic pulse reverse plating is used. The cathode and anode may be horizontally or vertically disposed in the tank.

During operation of the electrolytic plating system, copper metal is plated on the surface of a cathode substrate when the rectifier is energized. A pulse current, direct current, reverse periodic current, periodic pulse reverse current, step current or other suitable current may be employed. The temperature of the electrolytic solution may be maintained using a heater/cooler whereby electrolytic solution is removed from the holding tank and flows through the heater/cooler and then is recycled to the holding tank. The bath temperature is typically about room temperature such as about 20-27° C., but may be at elevated temperatures up to about 40° C. or higher. It is preferred to use an anode to cathode ratio of about 1:1, but this may also vary widely from about 1:4 to 4:1. The process also uses mixing in the electrolytic plating tank which may be supplied by agitation or preferably by the circulating flow of recycle electrolytic solution through the tank.

In one embodiment, the method of the present invention employs a current density profile in which initiation preferably occurs at a relatively low current density and in which the current density is increased after a period of copper deposition. Relatively low current densities may be used initially typically to avoid depleting copper ion locally near the bottom of the feature faster than the copper ion may be replenished. A situation wherein the depletion rate is faster than the replenishment rate may lead to the formation of a void. Optimal initial current densities and durations are typically determined experimentally and may vary depending upon the aspect ratio of the through silicon via feature. Increasing the initial relatively low current density to a relatively higher final current density may be continuous or according to a stepped profile. For example, in one embodiment, the current density may be stepped from an initiating current density to a second current density and stepped again to a final maximum current density. In one embodiment, there may be more than two current density steps, such as three, four, five, or more current density steps. Overall the current density averages between about 1 mA/cm$^2$ and about 10 mA/cm$^2$.

With reference again to FIG. 1, after via filling, the wafer surface and exposed copper metallization may be cleaned by chemical mechanical polishing, as is known in the art. The wafer may be thinned by conventional etching techniques to expose the bottom layer of copper metallization, thereby achieving through silicon via wherein copper metallization extends from the back surface of the wafer or IC die to the front, active surface of the wafer or die. The wafer may be further processed, stacked, and singulated by methods known in the art to achieve a device comprising multiple device levels, each connected electronically using through silicon via.

Having described the invention in detail, it will be apparent that modifications and variations are possible without departing from the scope of the invention defined in the appended claims.

EXAMPLES

The following non-limiting examples are provided to further illustrate the present invention.

Example 1

Electrolytic Copper Composition and Deposition

An electrolytic copper deposition composition according to the present invention was prepared comprising the following components:

Copper sulfate (Source may be copper sulfate or any of its hydrates added in an amount sufficient to provide 68 g/L Cu$^{2+}$ ions)

Sulfuric acid (Concentrated, sufficient to provide 20 g/L H$_2$SO$_4$)

Chloride ion source (Source and amount sufficient to provide 50 ppm Cl$^-$)

ViaForm® Extreme Accelerator available from Enthone Inc. (1 mL/L of a stock solution comprising 3 g/L 3,3'-dithiobis(1-propanesulfonic acid, which is sufficient to provide 3 ppm Accelerator)

ViaForm® Leveler available from Enthone Inc. (4 mL/L of a stock solution comprising 0.7 g/L of a reaction product of benzyl chloride and hydroxyethyl polyethyleneimine, which is sufficient to provide about 2.8 ppm Leveler)

This composition was used to metallize large, high aspect ratio through silicon vias. The vias had an aspect ratio of 4:1 (depth:opening diameter), resulting from an opening having a diameter of 25 micrometers and a total depth of 100 micrometers. The test wafers were degassed using MICROFAB® PW 1000 (available from Enthone Inc., West Haven, Conn.) and then immersed in the above-described electrolytic copper deposition composition (vertical coupon setup). The current density was supplied according to the following stepped profile:

1 mA/cm$^2$ for 5 minutes
9 mA/cm$^2$ for 90 minutes

Figure 2A:
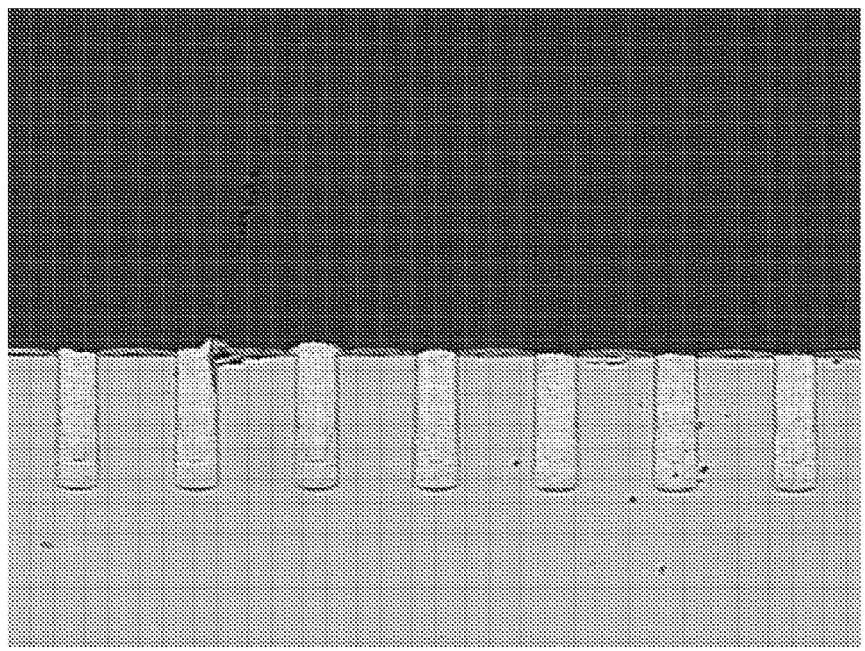
FIGS. 2A and 2B are photographs of cross sections of copper metallized TSV features. The features were filled according to the method described in Example 1.
Figure 2B:
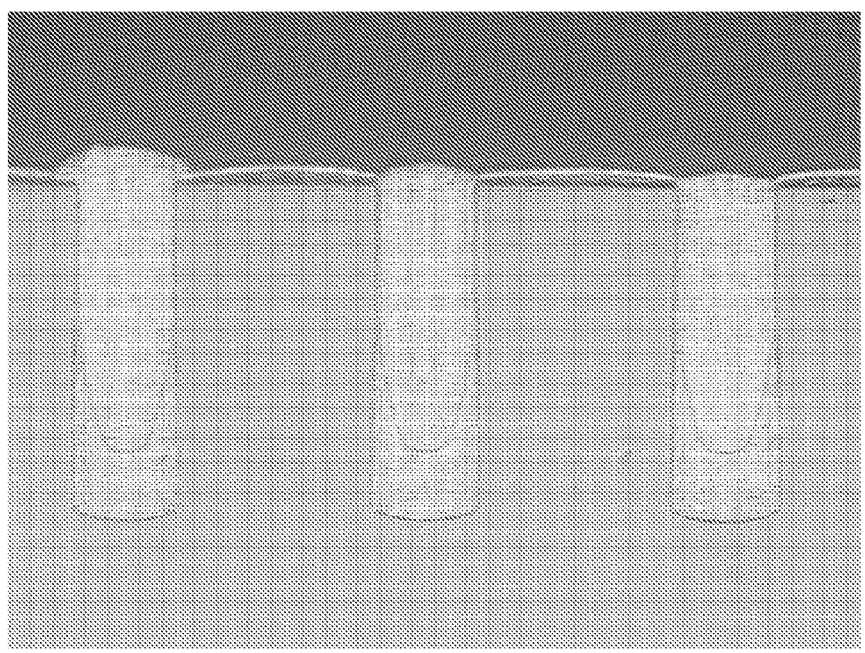
Figure 3A:
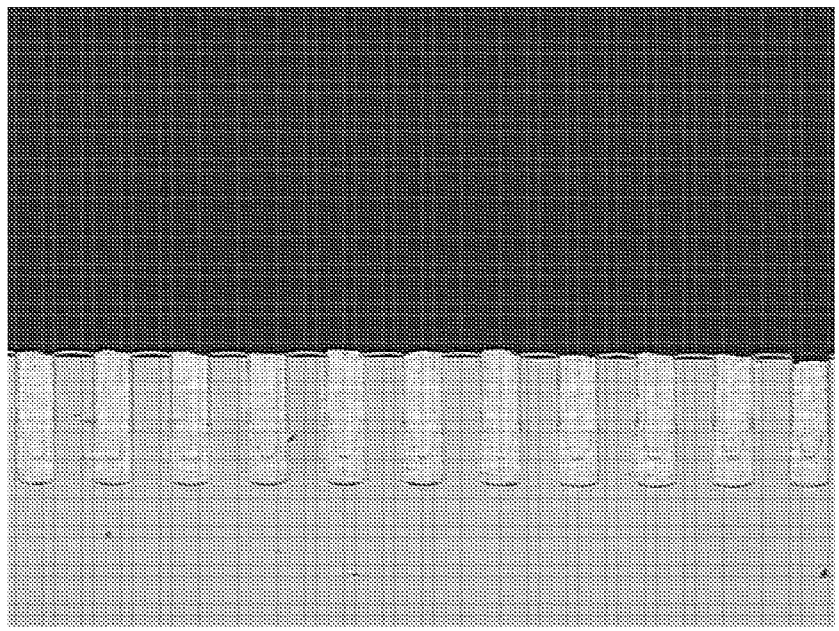
FIGS. 3A and 3B are photographs of cross sections of copper metallized TSV features. The features were filled according to the method described in Example 1.
Figure 3B:
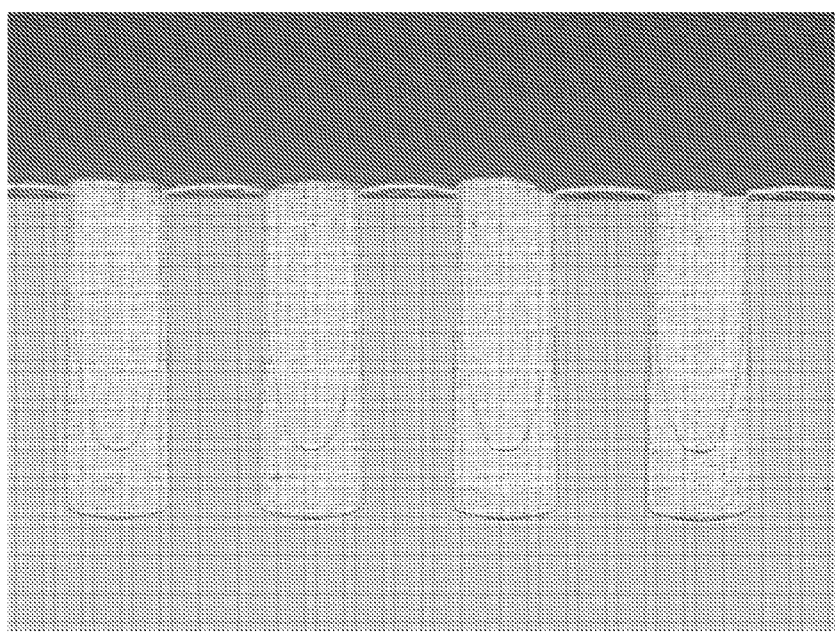

The vias were entirely copper metallized in about 95 minutes. FIGS. 2A and 2B are photographs of cross sections of completely filled TSV features. FIGS. 3A and 3B are photographs of cross sections of completely filled TSV features. The density of features in the wafer shown in FIGS. 3A and 3B was greater than the density of features in the wafer shown in FIGS. 2A and 2B. Plating occurred according to a bottom-up mechanism since the TSV were void-free and seam-free.

Example 2

Electrolytic Copper Composition and Deposition

The composition of Example 1 was used to metallize through silicon vias having a lower aspect ratio than the vias metallized in Example 1. The vias of this Example had an aspect ratio of 2:1 (depth:opening diameter), resulting from an opening having a diameter of 50 micrometers and a total depth of 100 micrometers. The test wafers were degassed using MICROFAB® PW 1000 (available from Enthone Inc., West Haven, Conn.) and then immersed in the electrolytic copper deposition composition (vertical coupon setup). The current density was supplied according to the following stepped profile:

1 mA/cm$^2$ for 5 minutes
9 mA/cm$^2$ for 90 minutes

Figure 4A:
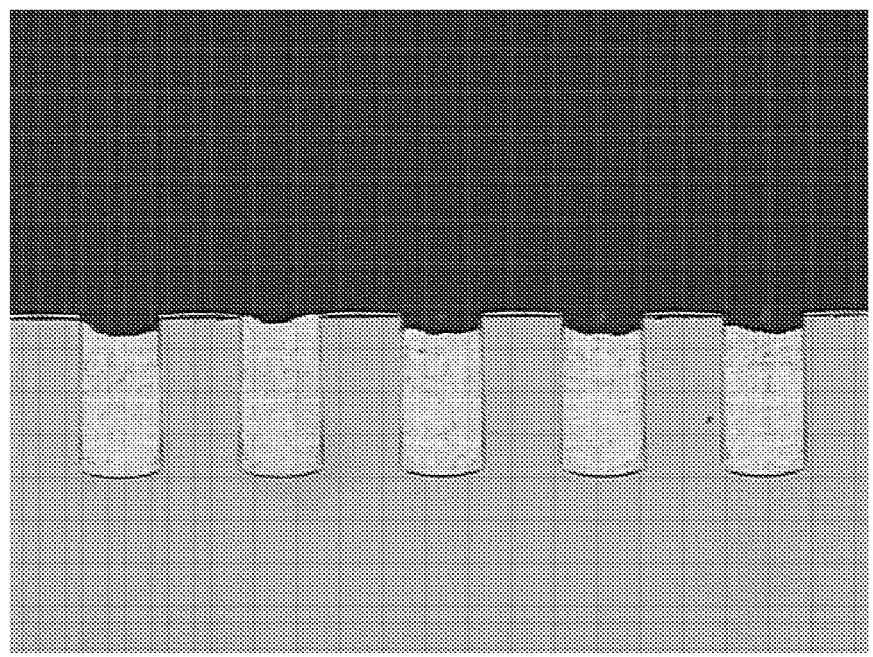
FIGS. 4A and 4B are photographs of cross sections of copper metallized TSV features. The features were filled according to the method described in Example 2.
Figure 4B:
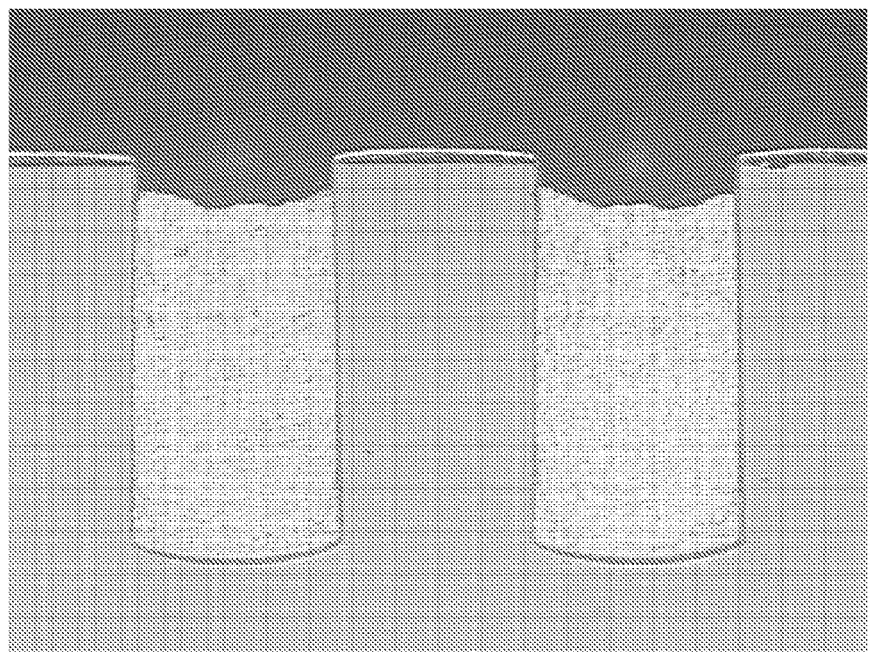
Figure 5A:
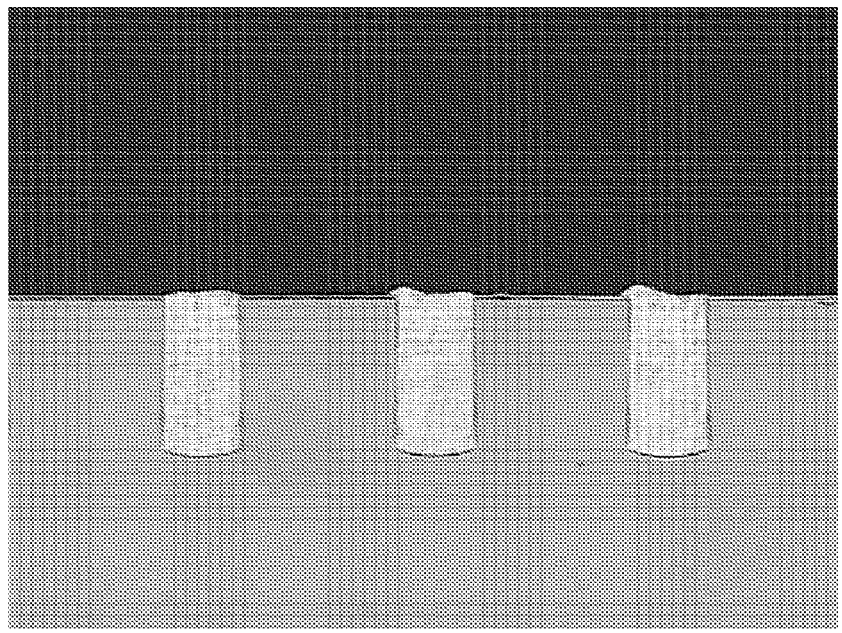
FIGS. 5A and 5B are photographs of cross sections of copper metallized TSV features. The features were filled according to the method described in Example 2.
Figure 5B:
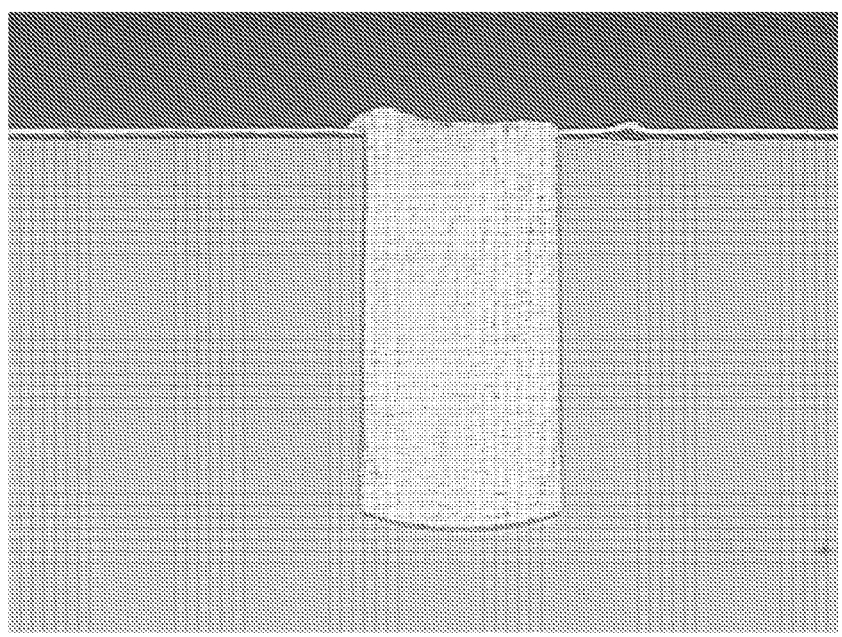

FIGS. 4A and 4B are photographs of cross sections of completely filled TSV features. The vias of FIGS. 4A and 4B were nearly entirely filled with copper metallization in about 95 minutes. FIGS. 5A and 5B are photographs of cross sections of completely filled TSV features. The vias of FIGS. 5A and 5B were entirely filled with copper metallization in about 95 minutes. Plating occurred according to a bottom-up mechanism since the TSV were void-free and seam-free.

Example 3

Electrolytic Copper Composition and Deposition

An electrolytic copper deposition composition according to the present invention was prepared comprising the following components:

Copper sulfate (Source may be copper sulfate or any of its hydrates added in an amount sufficient to provide 68 g/L Cu$^{2+}$ ions)

Sulfuric acid (Concentrated, sufficient to provide 20 g/L H$_2$SO$_4$)

Chloride ion source (Source and amount sufficient to provide 50 ppm Cl$^-$)

ViaForm® Extreme Accelerator available from Enthone Inc. (2 mL/L of a stock solution comprising 3 g/L 3,3'-dithiobis(1-propanesulfonic acid, which is sufficient to provide 6 ppm Accelerator)

ViaForm® Leveler available from Enthone Inc. (1 mL/L of a stock solution comprising 0.7 g/L of a reaction product of benzyl chloride and hydroxyethyl polyethyleneimine, which provides about 0.7 ppm Leveler)

Suppressor (25 mg/L of a glycerin-based polypropylene oxide polymer having a molecular weight of about 700)

Figure 6A:
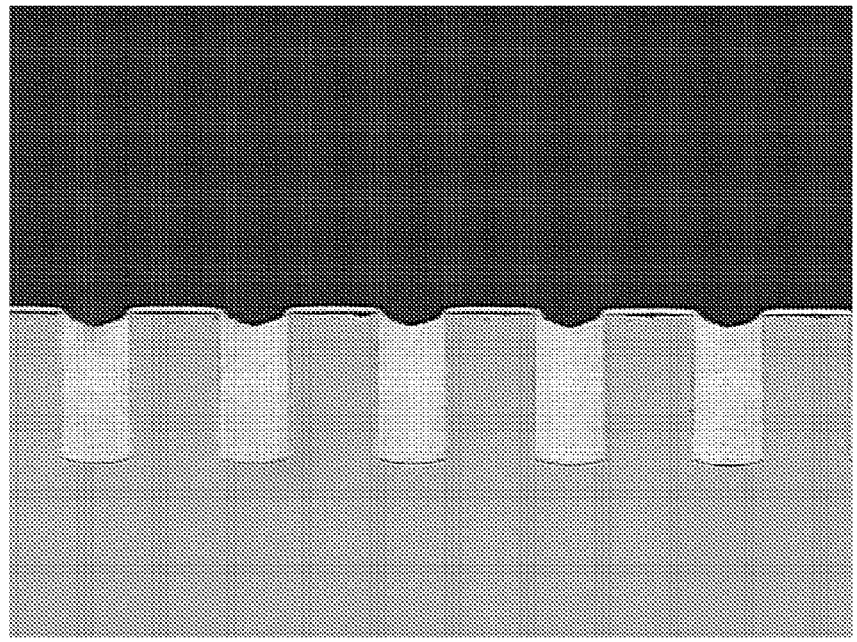
FIGS. 6A and 6B are photographs of cross sections of copper metallized TSV features. The features were filled according to the method described in Example 3.
Figure 6B:
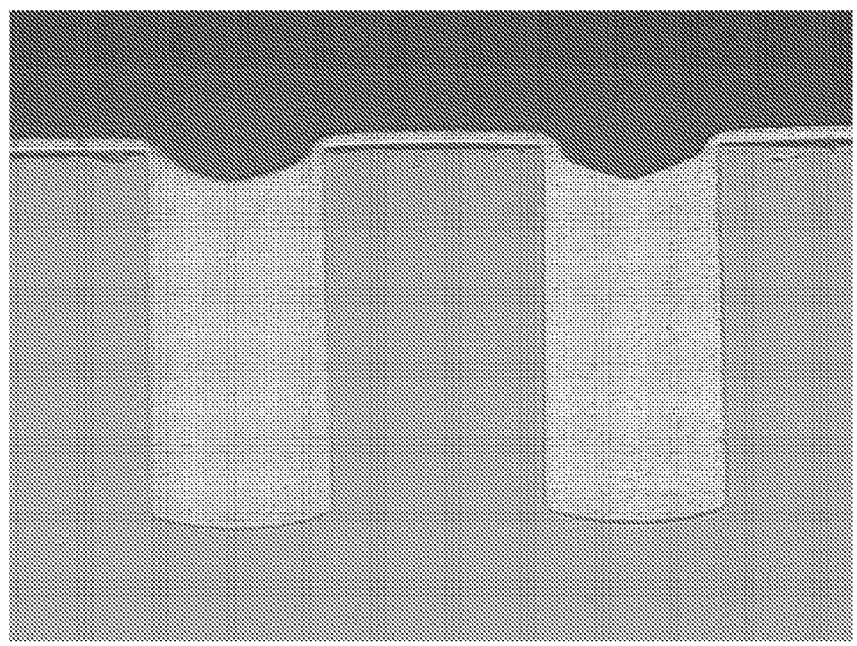

This composition was used to metallize low aspect ratio through silicon vias. The vias had an aspect ratio of 4:1 (depth:opening diameter), resulting from an opening having a diameter of 25 micrometers and a total depth of 100 micrometers. The test wafers were degassed using MICROFAB® PW 1000 (available from Enthone Inc., West Haven, Conn.) and then immersed in the electrolytic copper deposition composition (vertical coupon setup). The current density was supplied according to the following stepped profile:
1 mA/cm$^2$ for 5 minutes
9 mA/cm$^2$ for 90 minutes The vias were nearly entirely copper metallized in about 95 minutes. FIGS. 6A and 6B are photographs of cross sections of the filled TSV features. Plating occurred according to a bottom-up mechanism since the TSV were void-free and seam-free.

Example 4

Electrolytic Copper Composition and Deposition

An electrolytic copper deposition composition according to the present invention was prepared comprising the following components:
Copper sulfate (Source may be copper sulfate or any of its hydrates added in an amount sufficient to provide 50 g/L Cu$^{2+}$ ions)
Sulfuric acid (Concentrated, sufficient to provide 80 g/L H$_2$SO$_4$)
Chloride ion source (Source and amount sufficient to provide 50 ppm Cl$^-$)
ViaForm® Extreme Accelerator available from Enthone Inc. (0.5 mL/L of a stock solution comprising 3 g/L 3,3'-dithiobis(1-propanesulfonic acid, which is sufficient to provide 1.5 ppm Accelerator)
Leveler (Polymeric reaction product of 1,2-Bis(4-pyridyl) ethane and 1-chloro-2-(2-chloroethoxy)ethane (Structure (42)) having an average number of repeat units between 12 and 18; 4 mL/L of a stock solution comprising the Leveler)
Suppressor (Ralufon NAPE 14-90 available from Raschig, 12.5 ppm)

Figure 7A:
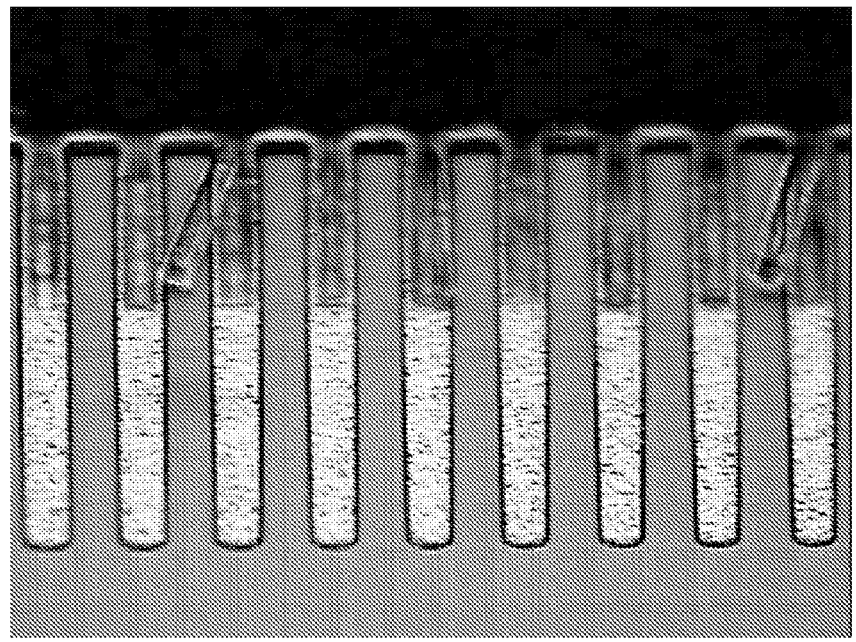
FIGS. 7A and 7B are photographs of cross sections of copper metallized TSV features. The features were filled according to the method described in Example 4.
Figure 7B:
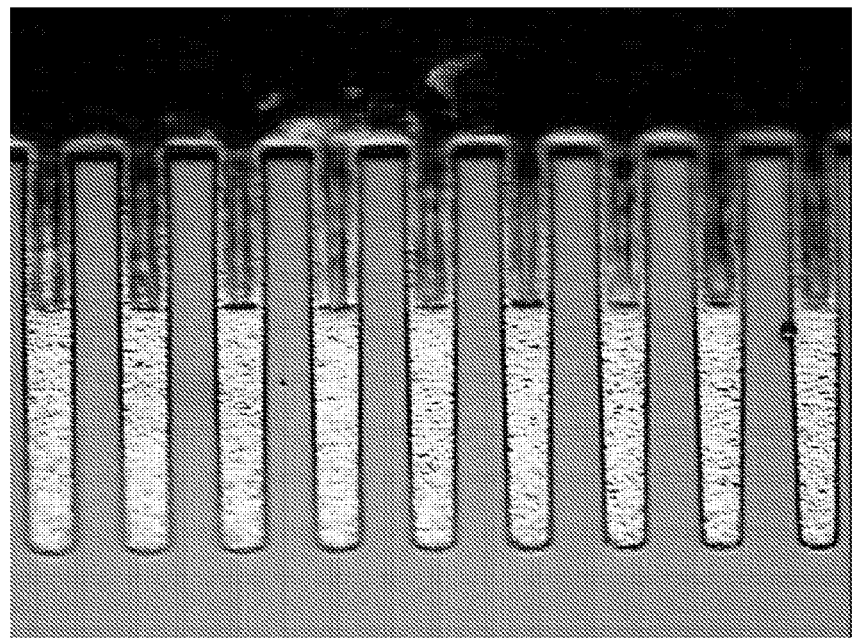

This composition was used to metallize through silicon vias in test wafers. The test wafers were degassed using MICROFAB® PW 1000 (available from Enthone Inc., West Haven, Conn.) and then immersed in the electrolytic copper deposition composition. The current density was supplied according to the following stepped profile:
1 mA/cm$^2$ for 5 minutes
1.5 mA/cm$^2$ for 5 minutes
2.0 mA/cm$^2$ for 5 minutes
2.5 mA/cm$^2$ for 5 minutes
3.0 mA/cm$^2$ for 5 minutes
3.5 mA/cm$^2$ for 5 minutes Photographs of the vias were taken at various stages of copper metallization. FIGS. 7A and 7B are photographs of the vias taken after 20 minutes of plating according to the following stepped profile:
1 mA/cm$^2$ for 5 minutes
1.5 mA/cm$^2$ for 5 minutes
2.0 mA/cm$^2$ for 5 minutes
2.5 mA/cm$^2$ for 5 minutes.

Figure 8A:
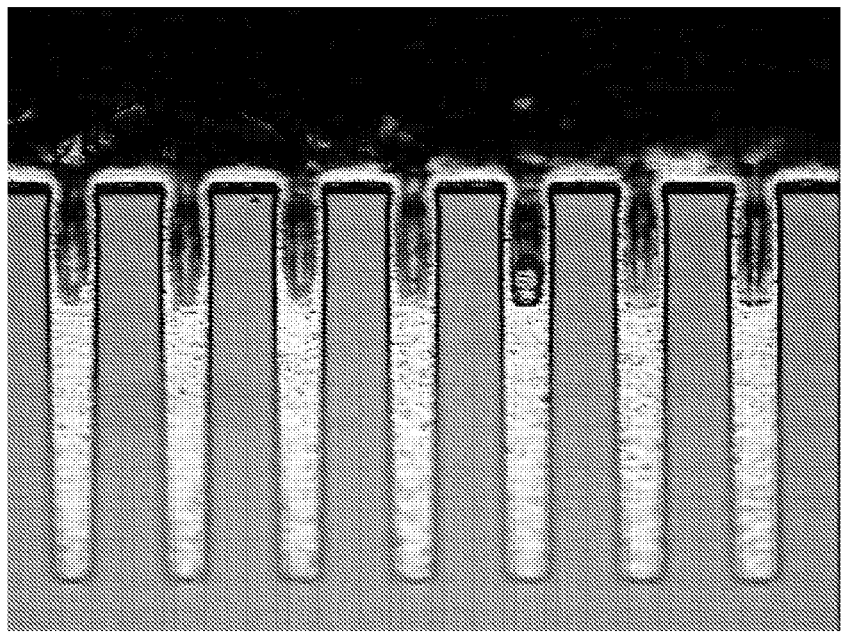
FIGS. 8A and 8B are photographs of cross sections of copper metallized TSV features. The features were filled according to the method described in Example 4.
Figure 8B:
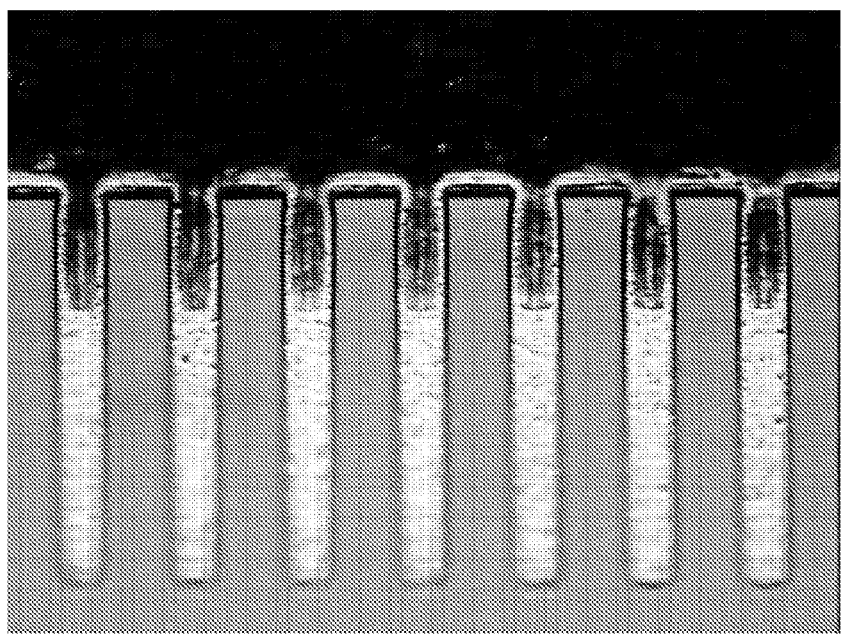
Figure 9A:
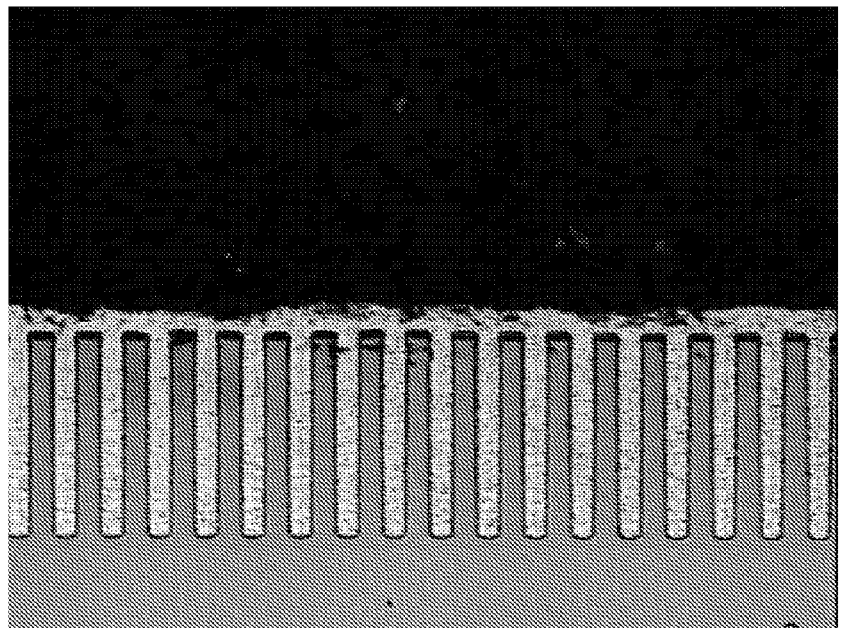
FIGS. 9A and 9B are photographs of cross sections of copper metallized TSV features. The features were filled according to the method described in Example 4.
Figure 9B:
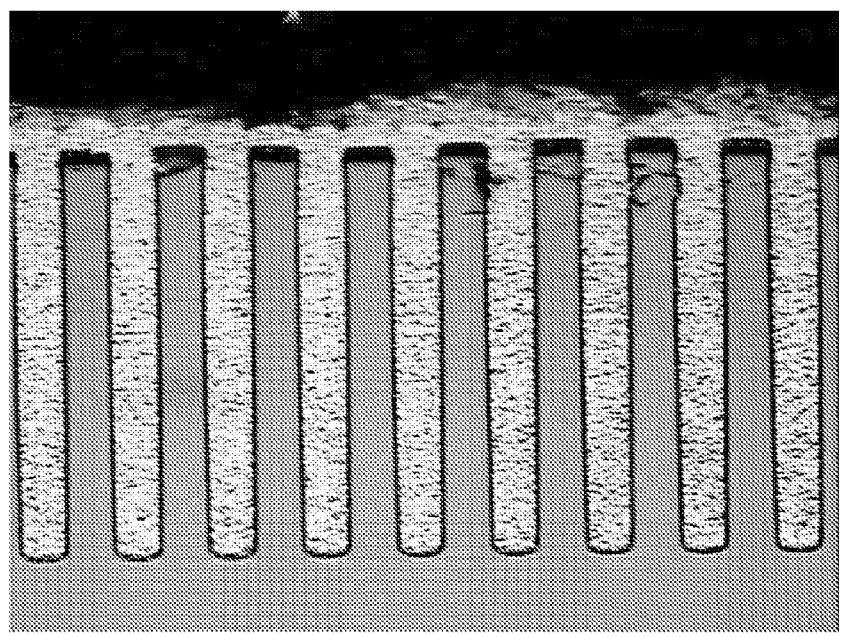
Figure 10A:
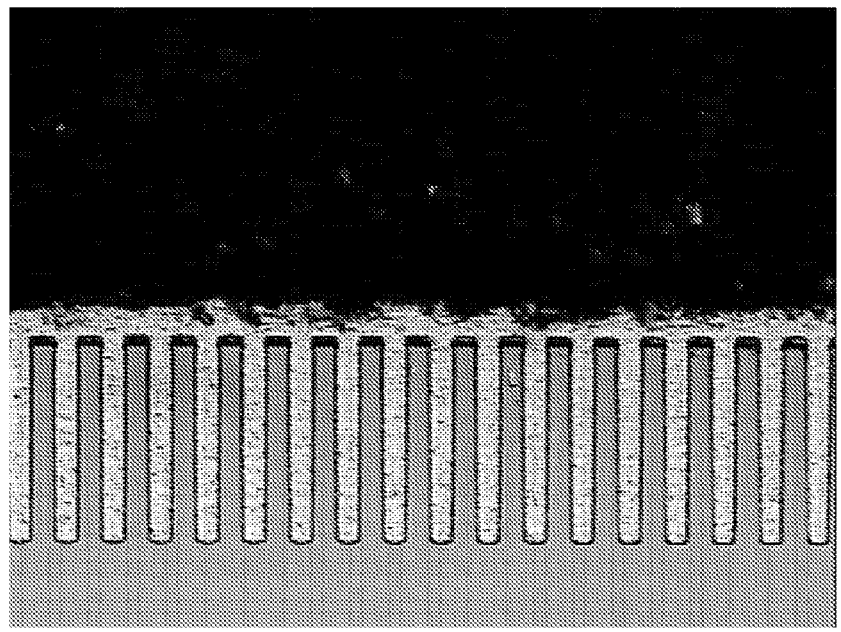
FIGS. 10A and 10B are photographs of cross sections of copper metallized TSV features. The features were filled according to the method described in Example 4.
Figure 10B:
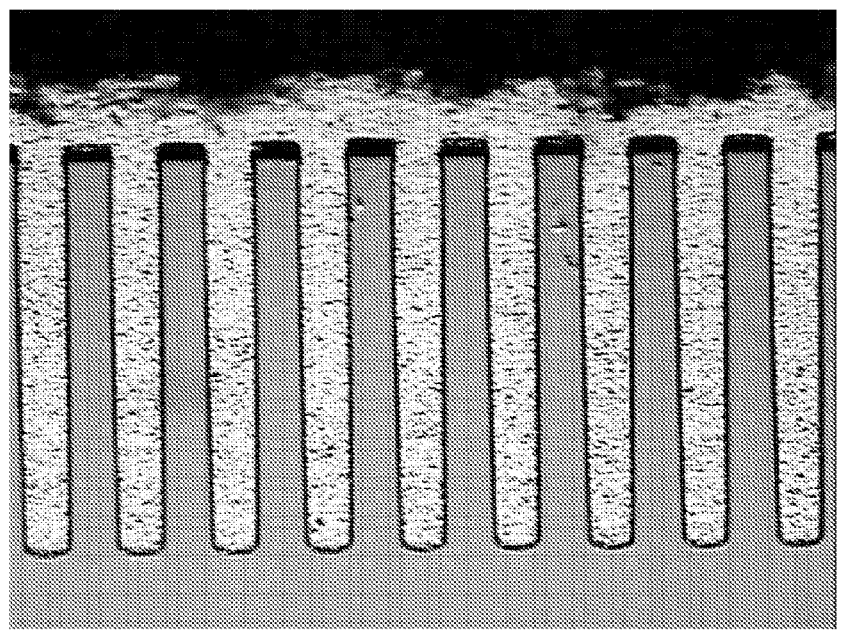
Figure 11A:
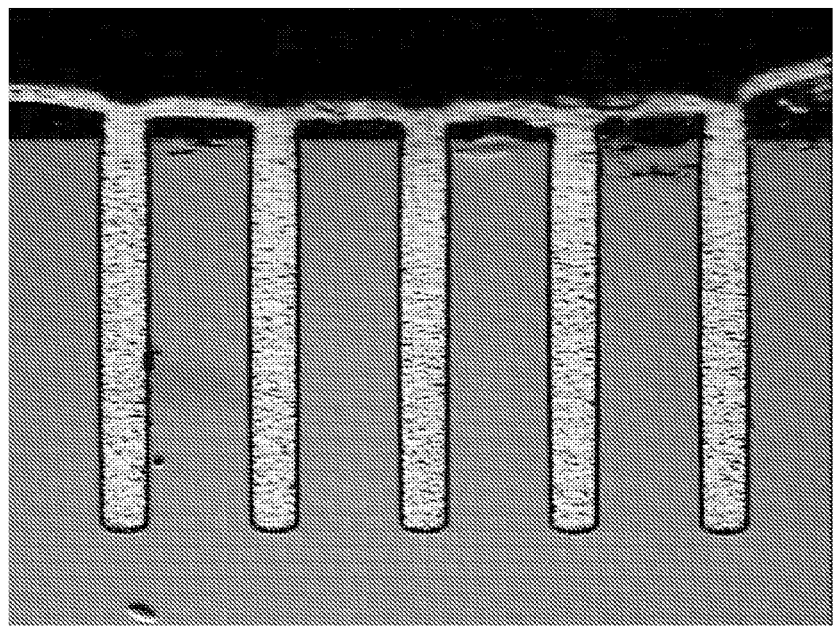
FIGS. 11A and 11B are photographs of cross sections of copper metallized TSV features. The features were filled according to the method described in Example 4.
Figure 11B:
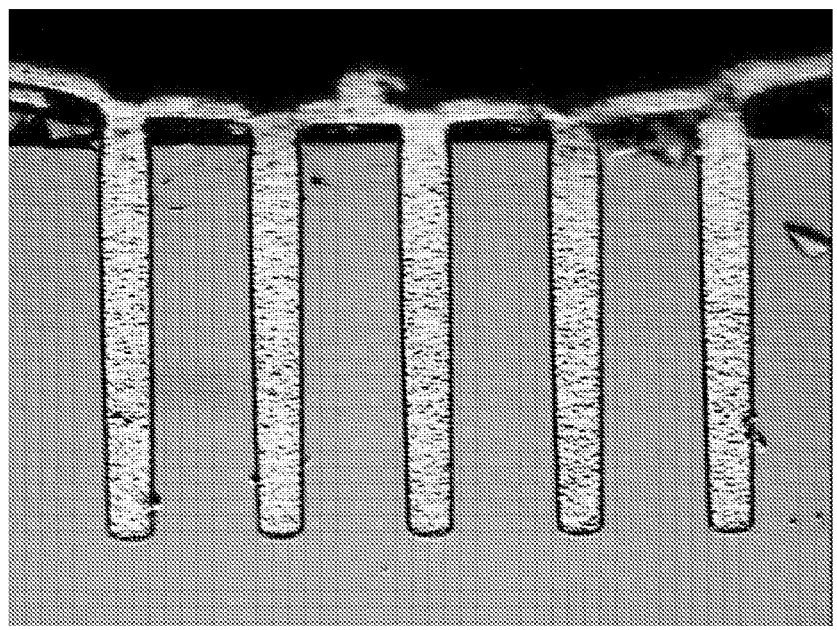

FIGS. 8A and 8B are photographs of the vias taken after 25 minutes of plating according to the following stepped profile:
1 mA/cm$^2$ for 5 minutes
1.5 mA/cm$^2$ for 5 minutes
2.0 mA/cm$^2$ for 5 minutes
2.5 mA/cm$^2$ for 5 minutes
3.0 mA/cm$^2$ for 5 minutes.

FIGS. 9A, 9B, 10A, 10B, 11A, and 11B are photographs of the vias taken after 30 minutes of plating according to the following stepped profile:
1 mA/cm$^2$ for 5 minutes
1.5 mA/cm$^2$ for 5 minutes
2.0 mA/cm$^2$ for 5 minutes
2.5 mA/cm$^2$ for 5 minutes
3.0 mA/cm$^2$ for 5 minutes
3.5 mA/cm$^2$ for 5 minutes.

Plating occurred according to a bottom-up mechanism since the TSV were void-free and seam-free.

Comparative Example 5

Electrolytic Copper Composition and Deposition

A comparative electrolytic copper deposition composition was prepared comprising a commercially available additive system appropriate for damascene metallization of sub-micron sized features. The composition contained the following components:
Copper sulfate (Source may be copper sulfate or any of its hydrates added in an amount sufficient to provide 68 g/L Cu$^{2+}$ ions)
Sulfuric acid (Concentrated, sufficient to provide 20 g/L H$_2$SO$_4$)
Chloride ion source (Source and amount sufficient to provide 50 ppm Cl$^-$)
ViaForm® Extreme Accelerator available from Enthone Inc. (3 mL/L of a stock solution comprising 3 g/L 3,3'-dithiobis(1-propanesulfonic acid, which is sufficient to provide 9 ppm Accelerator)
Leveler (16 mL/L)
Suppressor (16 mL/L)

Figure 12A:
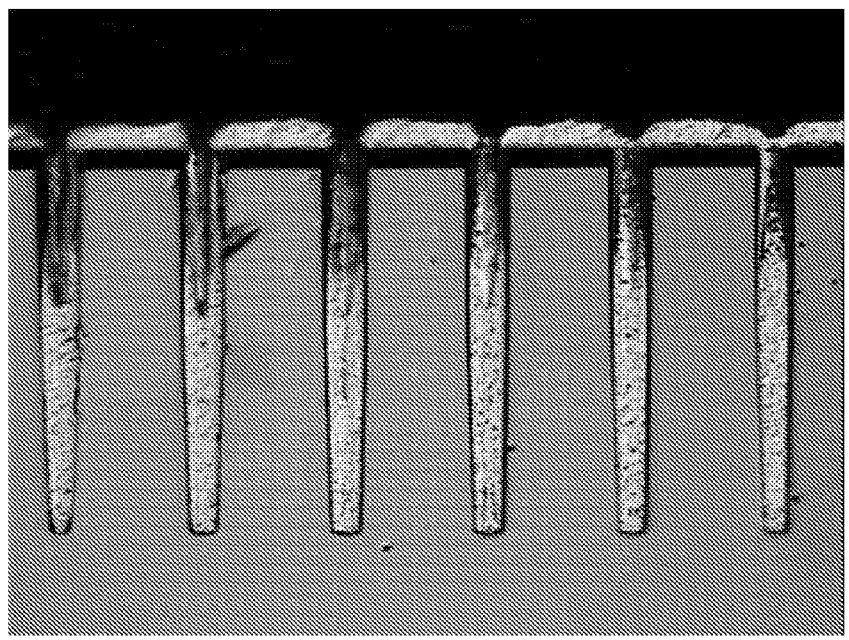
FIGS. 12A and 12B are photographs of cross sections of copper metallized TSV features. The features were filled according to the method described in Comparative Example 5.
Figure 12B:
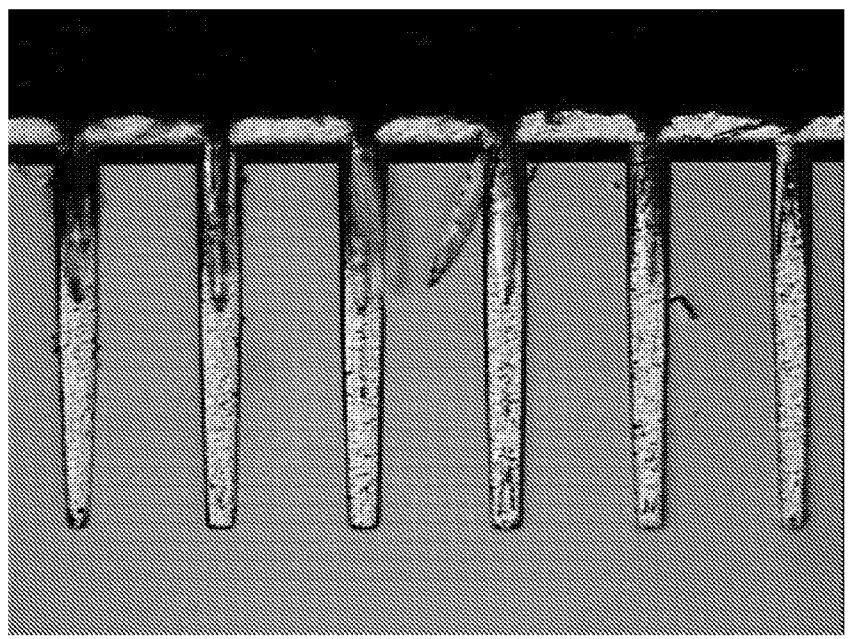

The composition was used to metallize very high aspect ratio though silicon via. The vias had an aspect ratio of 8:1 (depth:opening diameter), resulting from an opening having a diameter of 5 micrometers and a total depth of 40 micrometers. The test wafers were degassed using MICROFAB® PW 1000 (available from Enthone Inc., West Haven, Conn.) and then immersed in the electrolytic copper deposition composition. The current density was supplied according to the following stepped profile:
0.25 mA/cm$^2$ for 5 minutes
0.5 mA/cm$^2$ for 20 minutes The vias were copper metallized for about 25 minutes. FIGS. 12A and 12B are photographs of cross sections of the copper metallized TSV features. The vias were not completely filled. The vias contained seam voids, and plating occurred according to a V-shaped profile. As is apparent from FIGS. 12A and 12B, conventional chemistry that is suitable for damascene metallization of sub-micron sized features is not necessarily suitable for high aspect ratio, large size through silicon via.

Example 6

Electrolytic Copper Composition and Deposition

An electrolytic copper deposition composition according to the present invention was prepared comprising the following components:
Copper sulfate (Source may be copper sulfate or any of its hydrates added in an amount sufficient to provide 68 g/L Cu$^{2+}$ ions)
Sulfuric acid (Concentrated, sufficient to provide 20 g/L H$_2$SO$_4$)

Chloride ion source (Source and amount sufficient to provide 30 ppm Cl⁻)

ViaForm® Extreme Accelerator available from Enthone Inc. (2 mL/L of a stock solution comprising 3 g/L 3,3'-dithiobis(1-propanesulfonic acid, which is sufficient to provide 6 ppm Accelerator)

Leveler (Polymeric reaction product of 1,2-Bis(4-pyridyl)ethane and 1-chloro-2-(2-chloroethoxy)ethane (Structure (42)) having an average number of repeat units between 12 and 18; 4 mL/L of a stock solution comprising the Leveler)

Suppressor (2.5 mL/L)

This composition was used to metallize through silicon vias having an aspect ratio of 8:1 (depth:opening diameter), resulting from an opening having a diameter of 5 micrometers and a total depth of 40 micrometers. The test wafers were degassed using MICROFAB® PW 1000 (available from Enthone Inc., West Haven, Conn.) and then immersed in the electrolytic copper deposition composition. The current density was supplied according to the following stepped profile:

1 mA/cm² for 5 minutes
1.5 mA/cm² for 5 minutes

Figure 13:
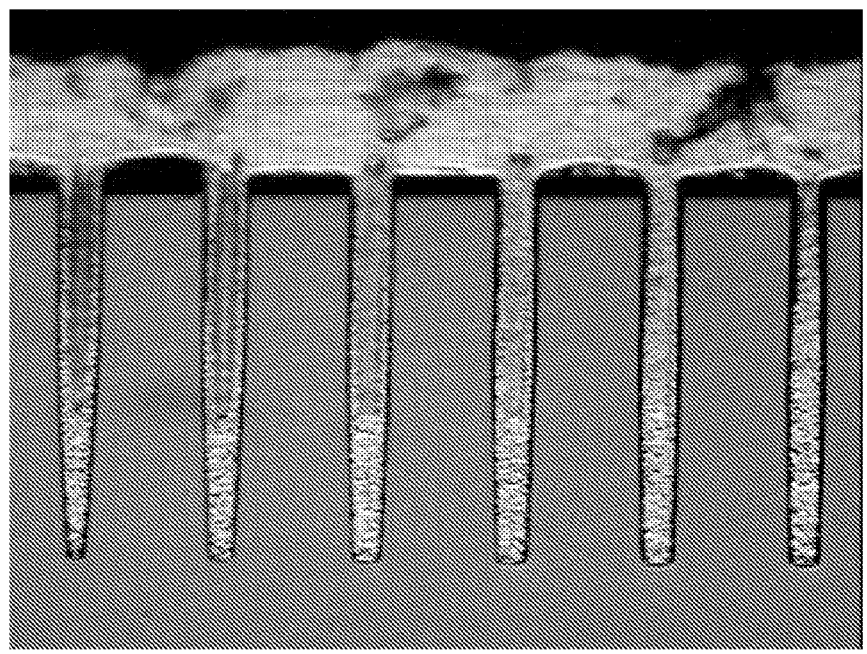
FIG. 13 is a photograph of cross sections of copper metallized TSV features. The features were filled according to the method described in Example 6.

Plating was discontinued after 10 minutes to observe the metallization profile. Compared to the results shown in Comparative Example 5, the composition of this example, which is according to the present invention, exhibited a better plating profile and no voids at the bottom. See FIG. 13, which are photographs of cross sections of the partially filled TSV features.

Example 7

Electrolytic Copper Composition and Deposition

The electrolytic copper deposition composition of Example 6 was slightly modified to comprise the following components:

Copper sulfate (Source may be copper sulfate or any of its hydrates added in an amount sufficient to provide 68 g/L Cu²⁺ ions)

Sulfuric acid (Concentrated, sufficient to provide 20 g/L H₂SO₄)

Chloride ion source (Source and amount sufficient to provide 50 ppm Cl⁻)

ViaForm® Extreme Accelerator available from Enthone Inc. (0.5 mL/L of a stock solution comprising 3 g/L 3,3'-dithiobis(1-propanesulfonic acid, which is sufficient to provide 1.5 ppm Accelerator)

Leveler (Polymeric reaction product of 1,2-Bis(4-pyridyl)ethane and 1-chloro-2-(2-chloroethoxy)ethane (Structure (42)) having an average number of repeat units between 12 and 18; 4 mL/L of a stock solution comprising the Leveler)

Suppressor (2.5 mL/L)

This composition was used to metallize vias having an aspect ratio of 8:1 (depth:opening diameter), resulting from an opening having a diameter of 5 micrometers and a total depth of 40 micrometers. The test wafers were degassed using MICROFAB® PW 1000 (available from Enthone Inc., West Haven, Conn.) and then immersed in the electrolytic copper deposition composition. The current density was supplied according to a stepped profile, and photographs of the metallized vias were taken periodically during metallization.

Figure 14A:
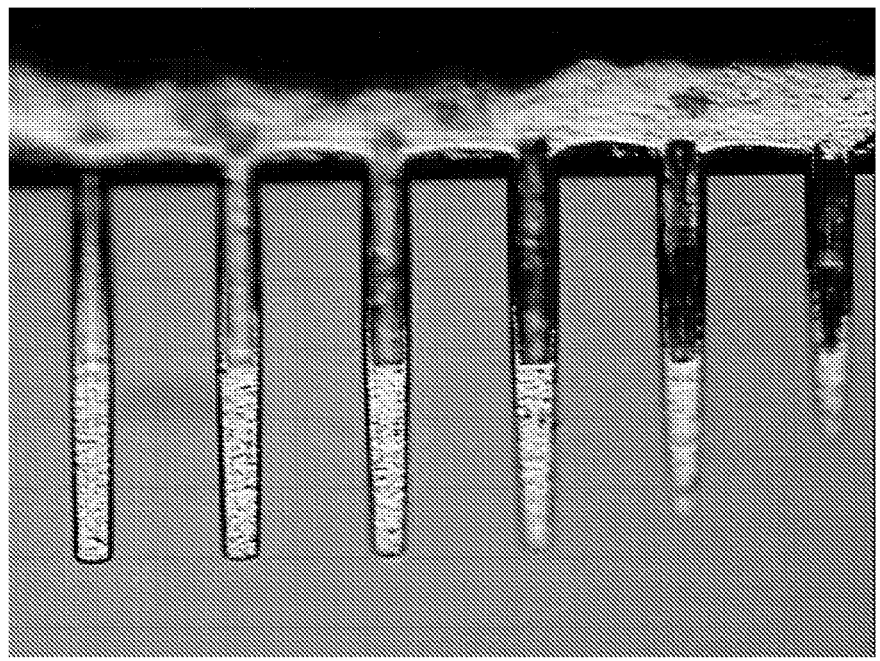
FIGS. 14A and 14B are photographs of cross sections of copper metallized TSV features. The features were filled according to the method described in Example 7.
Figure 14B:
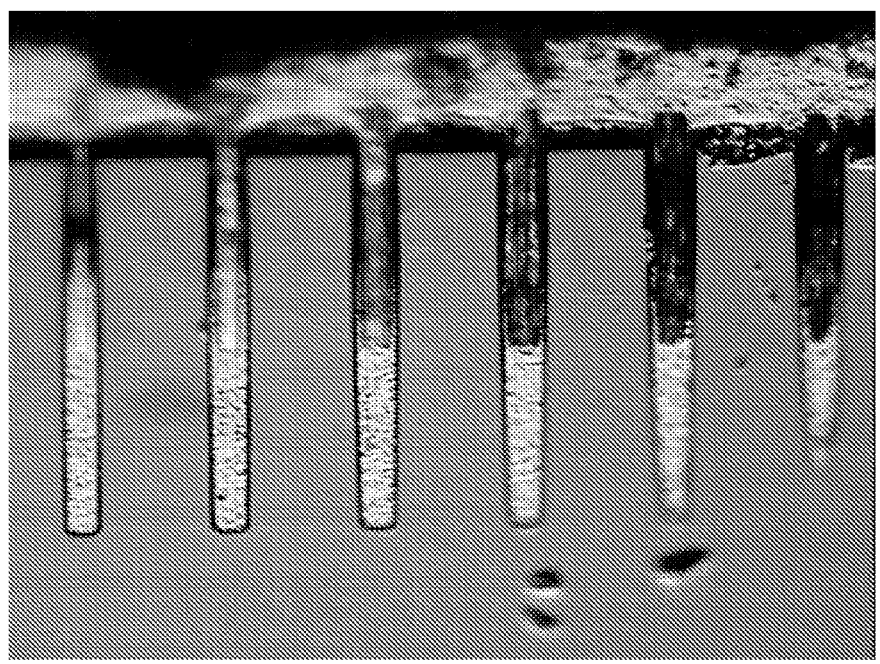

FIGS. 14A and 14B are photographs of the cross sections that were taken after 15 minutes of plating according to the following stepped profile:

1 mA/cm² for 5 minutes
1.5 mA/cm² for 5 minutes
2.0 mA/cm² for 5 minutes.

Figure 15A:
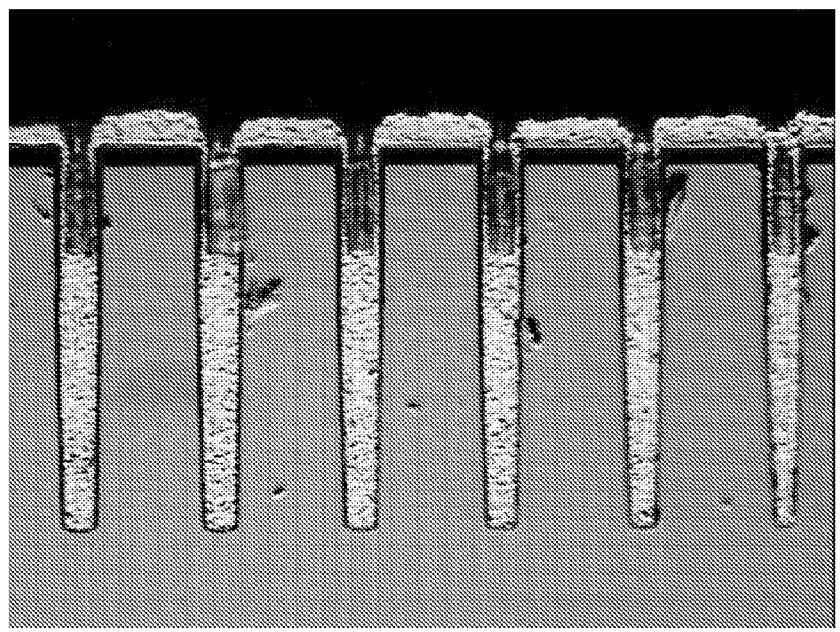
FIGS. 15A and 15B are photographs of cross sections of copper metallized TSV features. The features were filled according to the method described in Example 7.
Figure 15B:
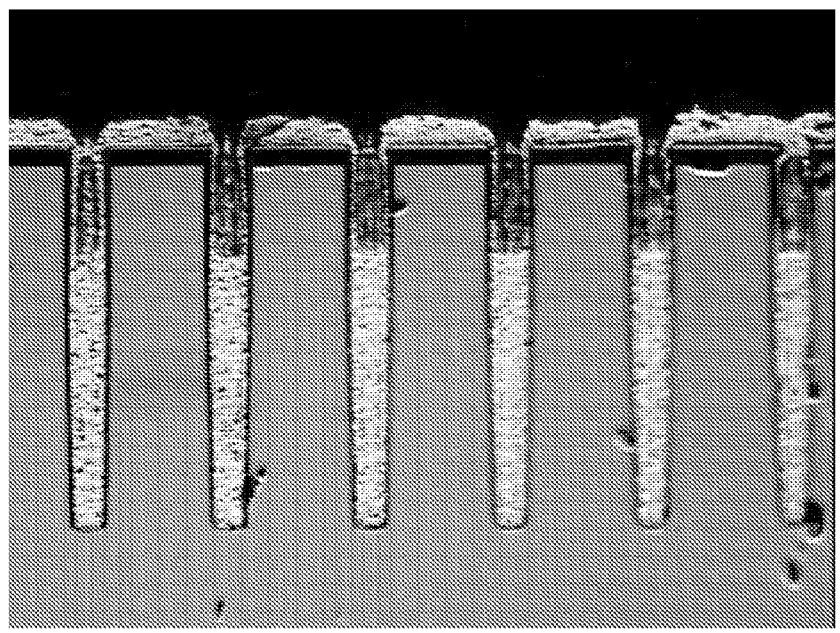

FIGS. 15A and 15B are photographs of the cross sections that were taken after 20 minutes of plating (the vias were about two thirds full) according to the following stepped profile:

1 mA/cm² for 5 minutes
1.5 mA/cm² for 5 minutes
2.0 mA/cm² for 5 minutes
2.5 mA/cm² for 5 minutes.

Figure 16A:
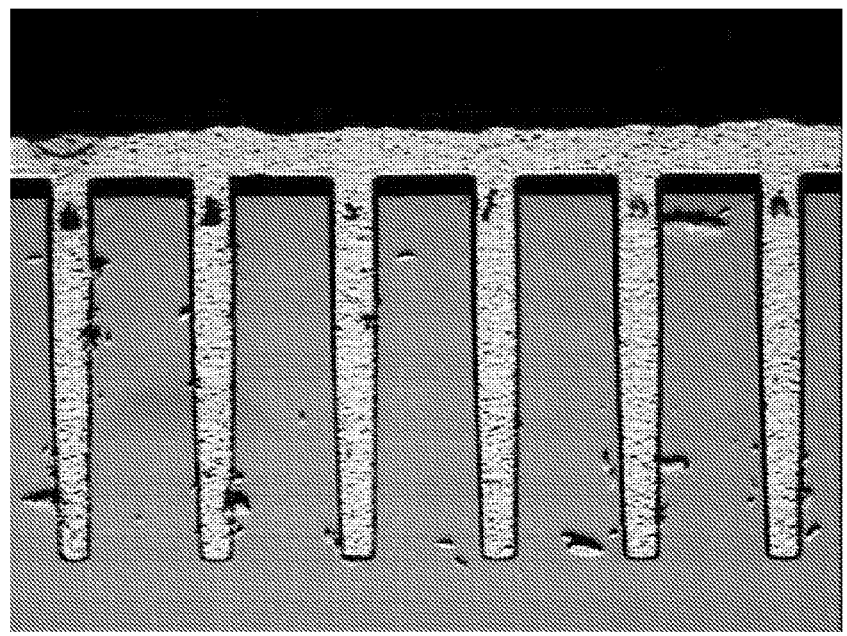
FIGS. 16A and 16B are photographs of cross sections of copper metallized TSV features. The features were filled according to the method described in Example 7.
Figure 16B:
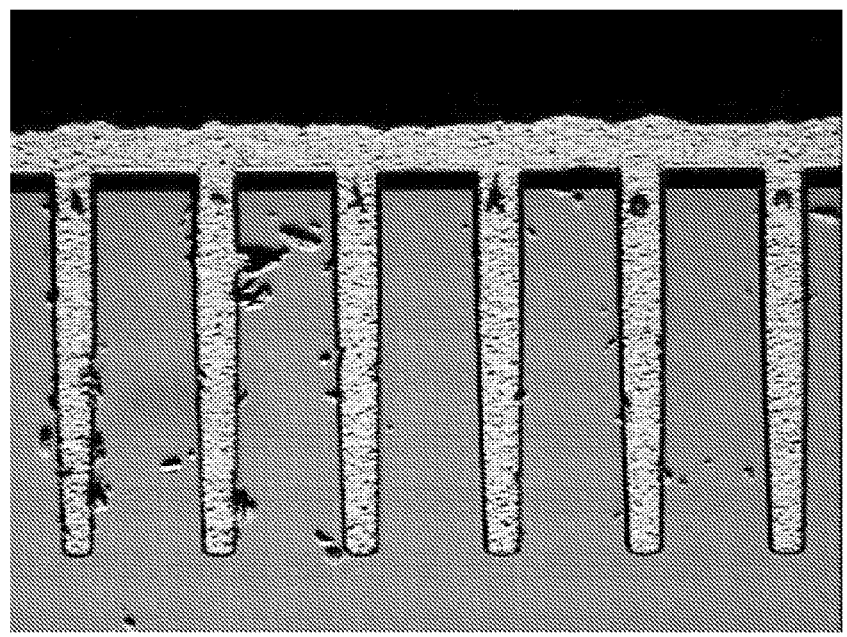

FIGS. 16A and 16B are photographs of the cross sections that were taken after 55 minutes of plating (the vias were fully metallized) according to the following stepped profile:

1 mA/cm² for 5 minutes
1.5 mA/cm² for 10 minutes
2.0 mA/cm² for 15 minutes
2.5 mA/cm² for 15 minutes
3.0 mA/cm² for 10 minutes.

The impurities concentrations of the filled copper were measured by SIMS, which measured carbon, oxygen, sulfur, chloride, and nitrogen content of the filled copper. The total impurities concentration was less than 30 ppm.

Example 8

Electrolytic Copper Composition and Deposition

An electrolytic copper deposition composition according to the present invention was prepared comprising the following components:

Copper sulfate (Source may be copper sulfate or any of its hydrates added in an amount sufficient to provide 55 g/L Cu²⁺ ions)

Sulfuric acid (Concentrated, sufficient to provide 100 g/L H₂SO₄)

Chloride ion source (Source and amount sufficient to provide 50 ppm Cl⁻)

ViaForm® Extreme Accelerator available from Enthone Inc. (0.5 mL/L of a stock solution comprising 3 g/L 3,3'-dithiobis(1-propanesulfonic acid, which is sufficient to provide 1.5 ppm Accelerator)

Leveler (Polymeric reaction product of 1,3-Bis(4-pyridyl)propane and 1-chloro-2-(2-chloroethoxy)ethane (Structure (48)); 3 mL/L)

Suppressor (Propoxylated glycerin having a molecular weight of about 700 g/mol; 5 mL/L).

Figure 17A:
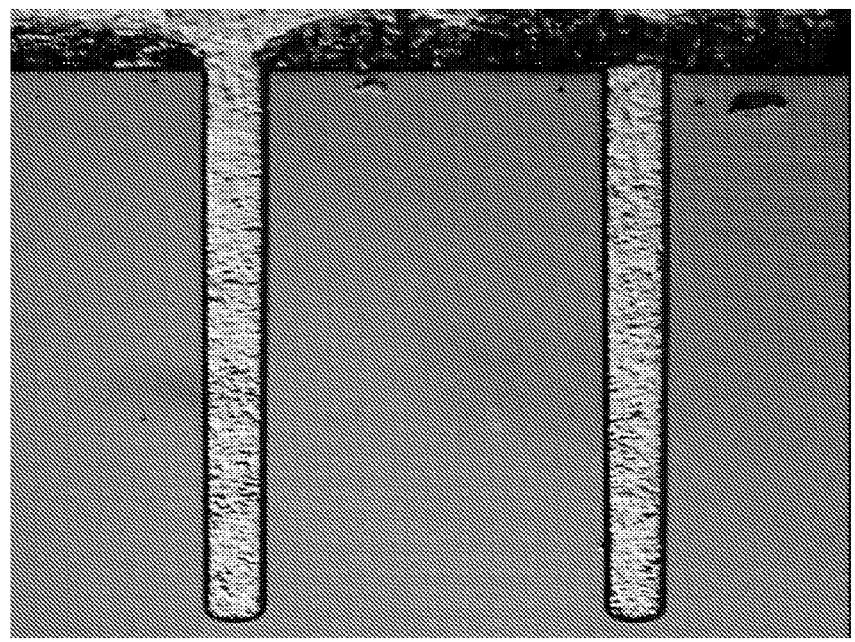
FIGS. 17A and 17B are photographs of cross sections of fully copper metallized TSV vias. The features were filled according to the method described in Example 8.
Figure 17B:
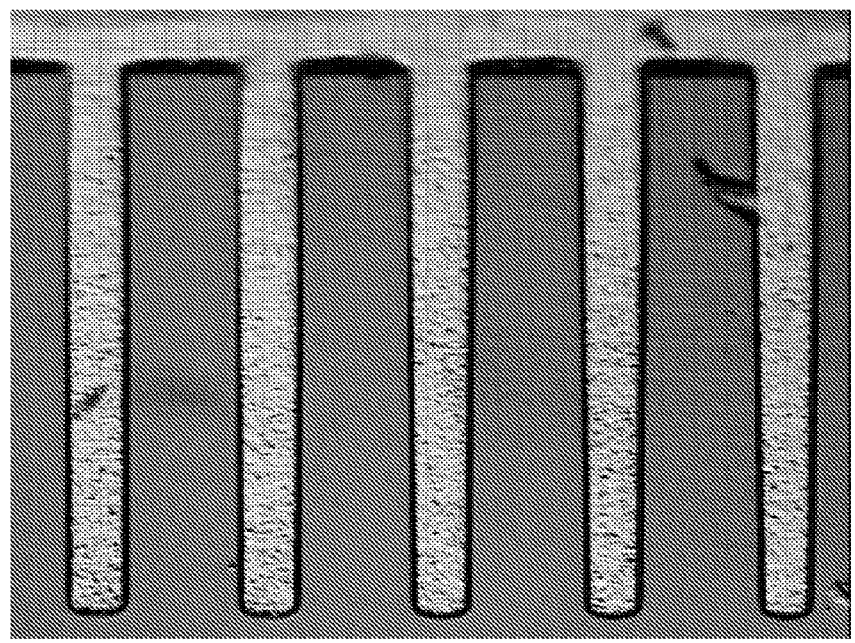

This composition was used to metallize vias having an aspect ratio of 10:1 (depth:opening diameter), resulting from an opening having a diameter of 6 micrometers and a total depth of 60 micrometers. The test wafers were degassed using MICROFAB® PW 1000 (available from Enthone Inc., West Haven, Conn.) and then immersed in the electrolytic copper deposition composition. The current density was 4 mA/cm². Plating was stopped after 50 minutes. FIGS. 17A and 17B are photographs of the fully metallized vias. Fill was void-free.

Example 9

Electrolytic Copper Composition and Deposition

An electrolytic copper deposition composition according to the present invention was prepared comprising the following components:

Copper sulfate (Source may be copper sulfate or any of its hydrates added in an amount sufficient to provide 55 g/L $Cu^{2+}$ ions)

Sulfuric acid (Concentrated, sufficient to provide 100 g/L $H_2SO_4$)

Chloride ion source (Source and amount sufficient to provide 50 ppm $Cl^-$)

ViaForm® Extreme Accelerator available from Enthone Inc. (0.5 mL/L of a stock solution comprising 3 g/L 3,3'-dithiobis(1-propanesulfonic acid, which is sufficient to provide 1.5 ppm Accelerator)

Leveler (Polymeric reaction product of 1,3-Bis(4-pyridyl)propane and 1-chloro-2-(2-chloroethoxy)ethane (Structure (48)); 4 mL/L)

Suppressor (Propoxylated glycerin having a molecular weight of about 700 g/mol; 5 mL/L).

Figure 18A:
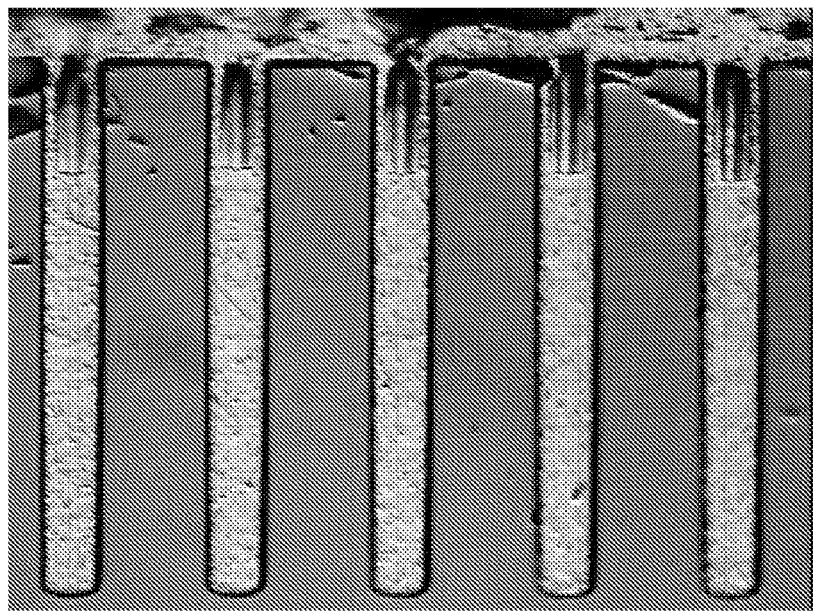
FIGS. 18A and 18B are photographs of cross sections of copper metallized TSV vias. The features were filled according to the method described in Example 9.
Figure 18B:
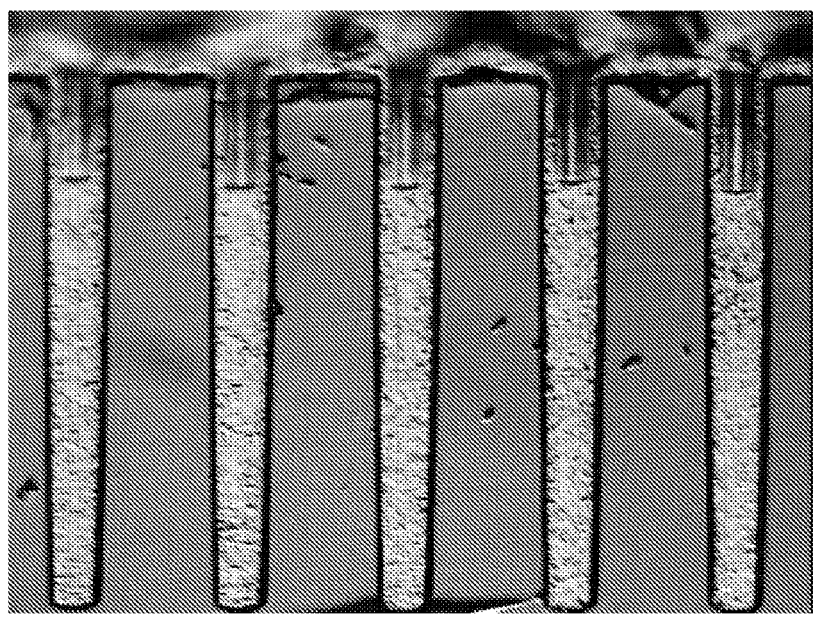
Figure 19A:
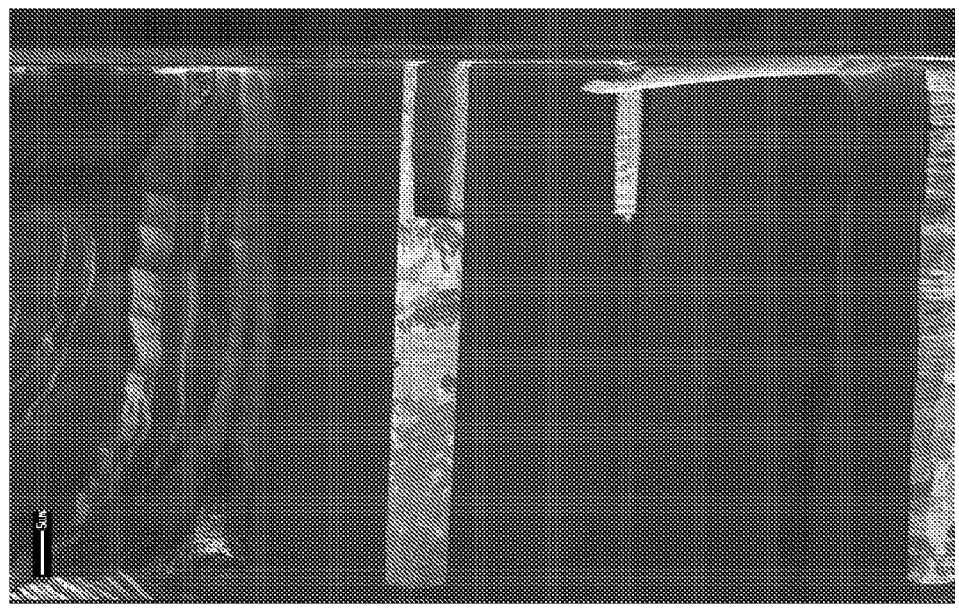
FIGS. 19A, 19B, 19C, and 19D are images of cross sections of copper metallized TSV vias obtained by focused ion beam. The features were filled according to the method described in Example 10.
Figure 19B:
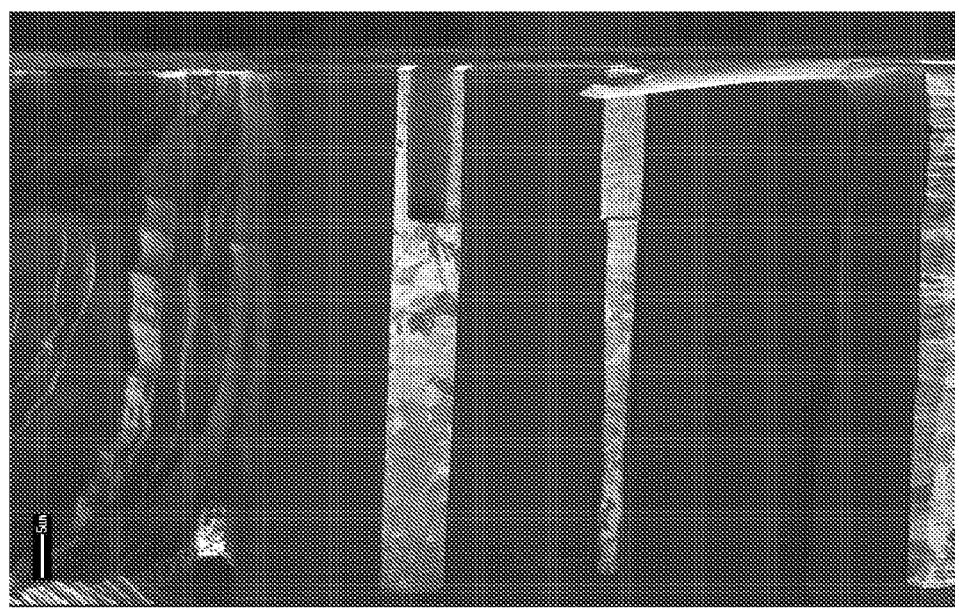
Figure 19C:
Figure 19D:
Figure 20A:
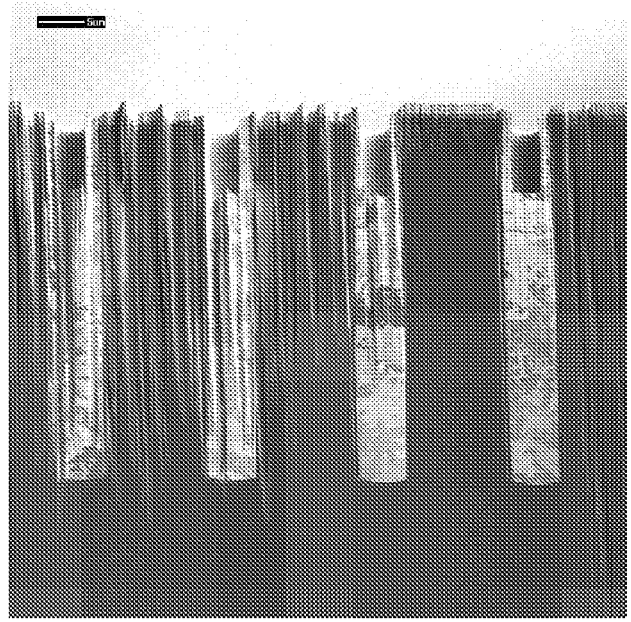
FIGS. 20A, 20B, 20C, and 20D are images of cross sections of copper metallized TSV vias obtained by focused ion beam. The features were filled according to the method described in Example 11.
Figure 20B:
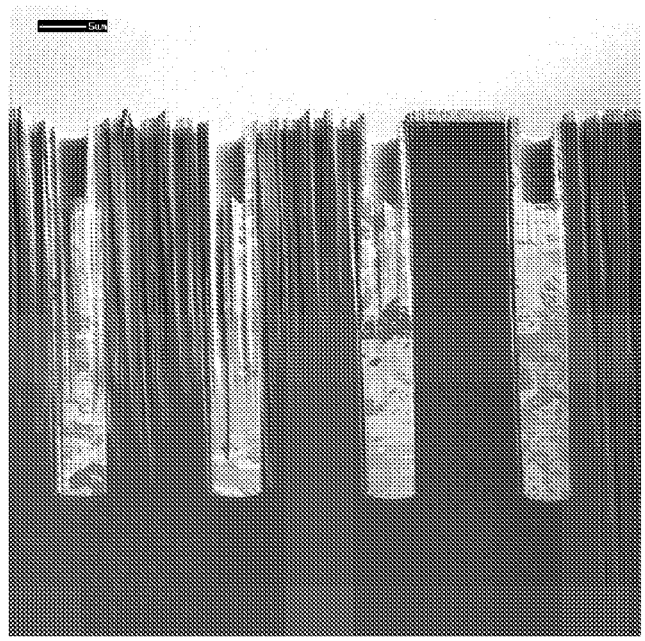
Figure 20C:
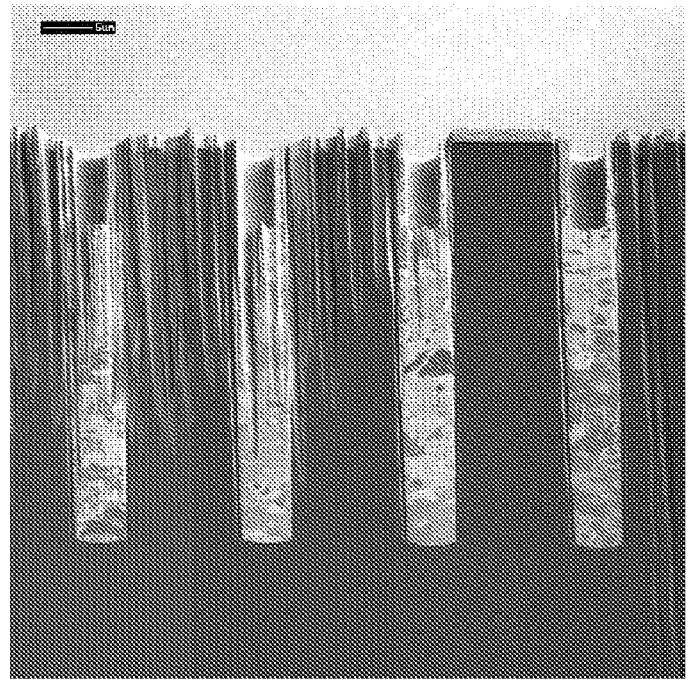
Figure 20D:
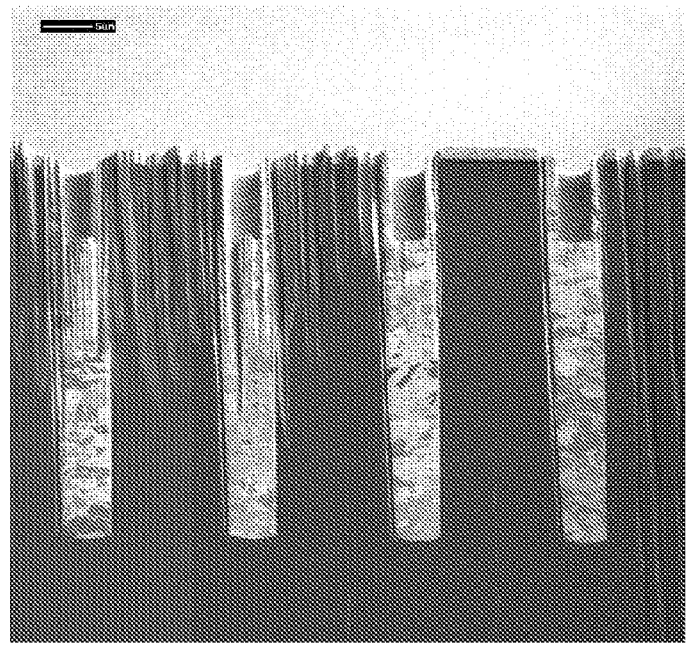
Figure 21A:
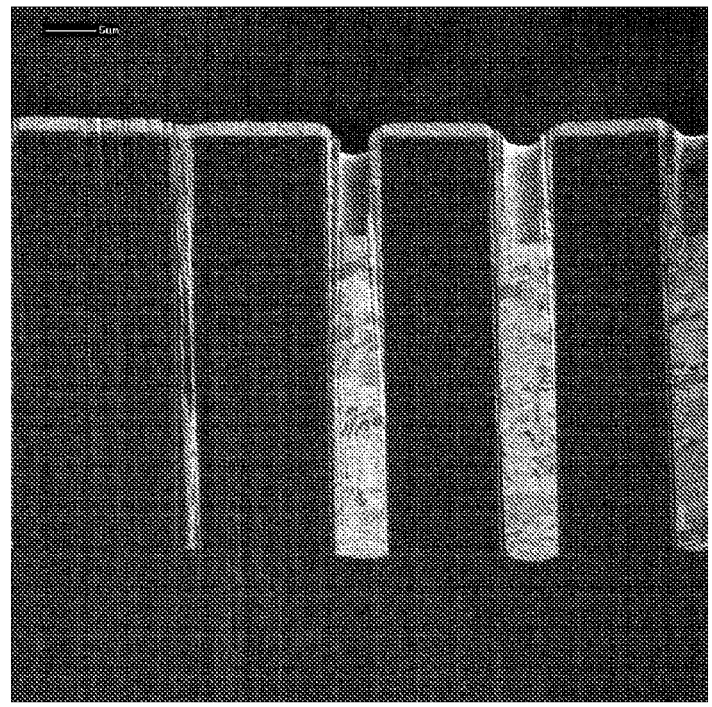
FIGS. 21A, 21B, 21C, and 21D are images of cross sections of copper metallized TSV vias obtained by focused ion beam. The features were filled according to the method described in Example 12.
Figure 21B:
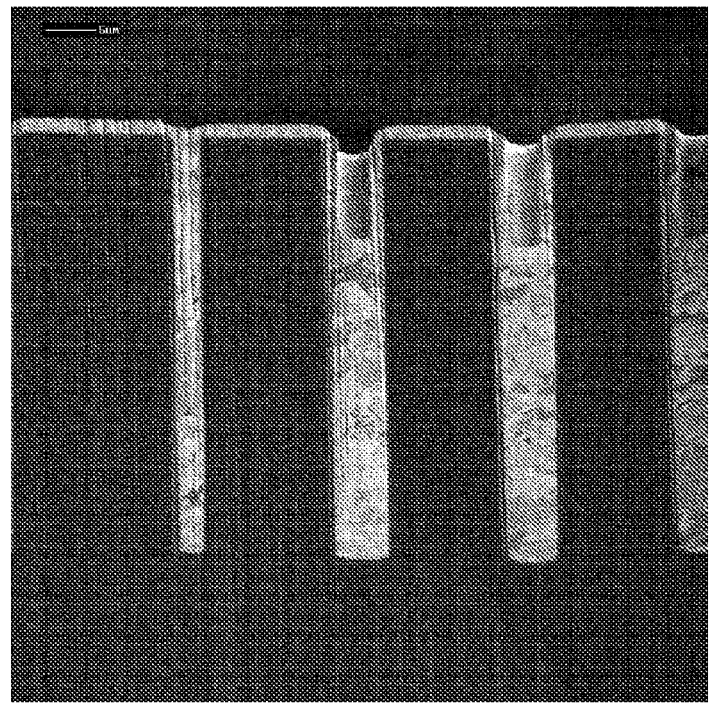
Figure 21C:
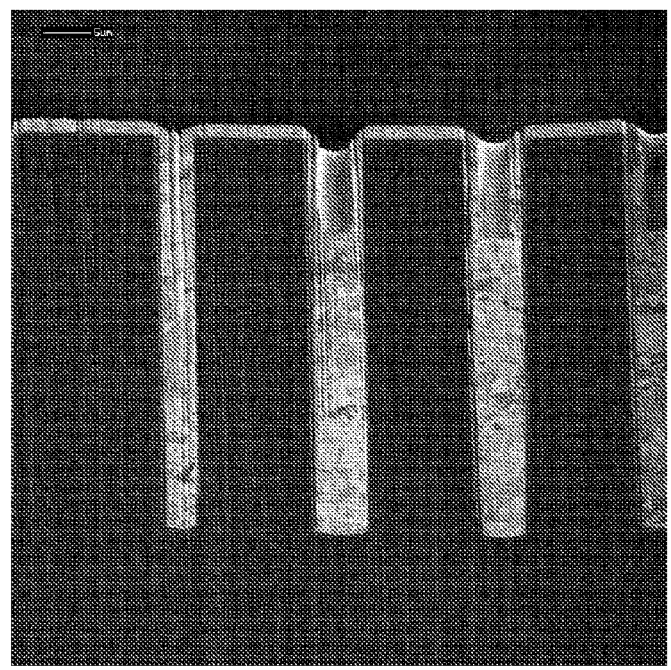
Figure 21D:
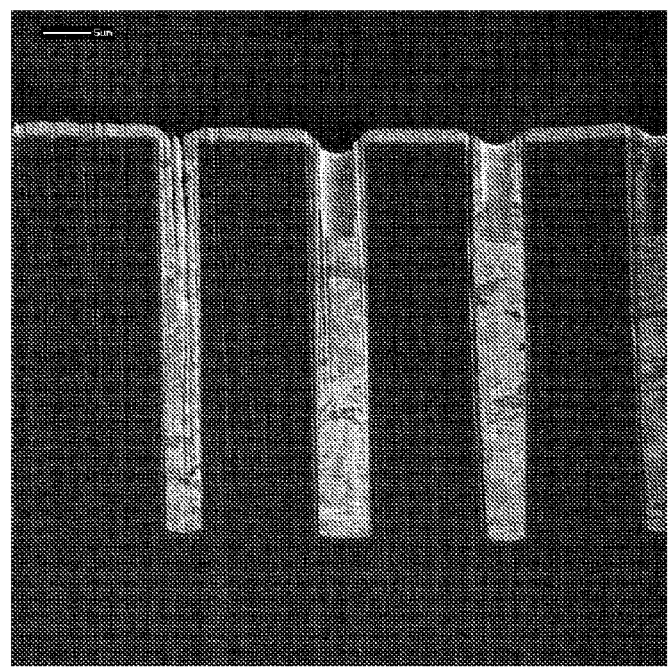
Figure 22A:
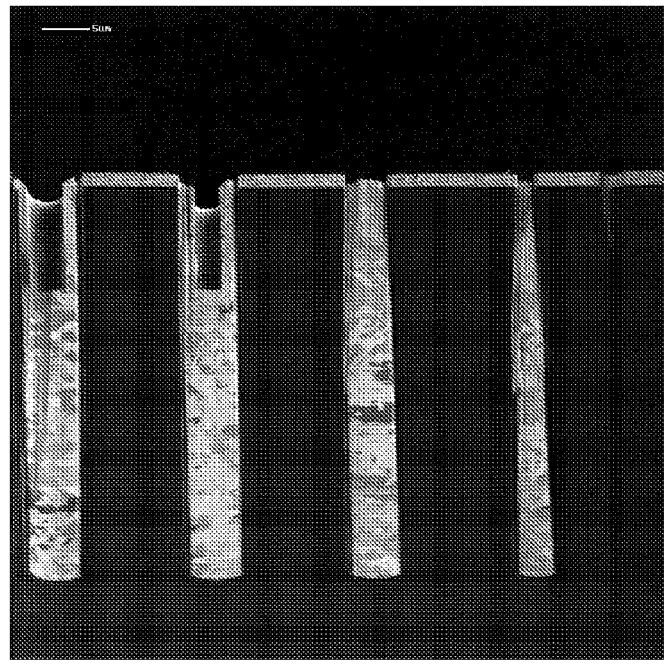
FIGS. 22A, 22B, 22C, and 22D are images of cross sections of copper metallized TSV vias obtained by focused ion beam. The features were filled according to the method described in Example 13.
Figure 22B:
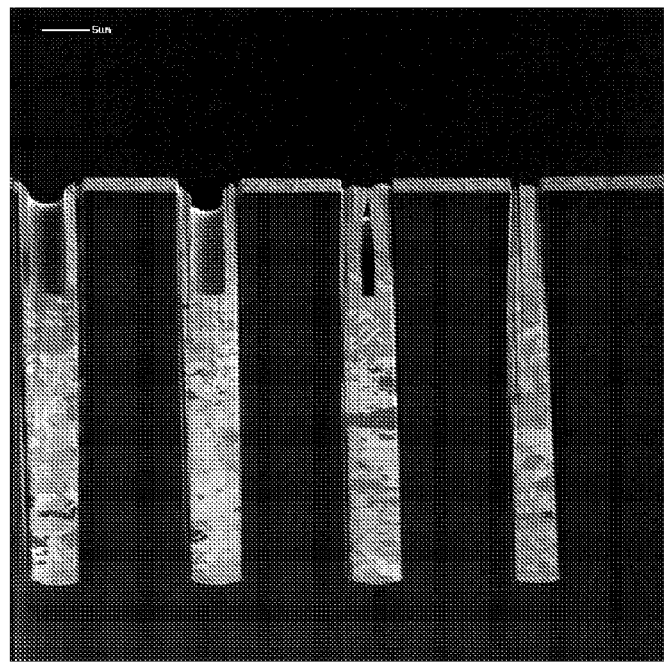
Figure 22C:
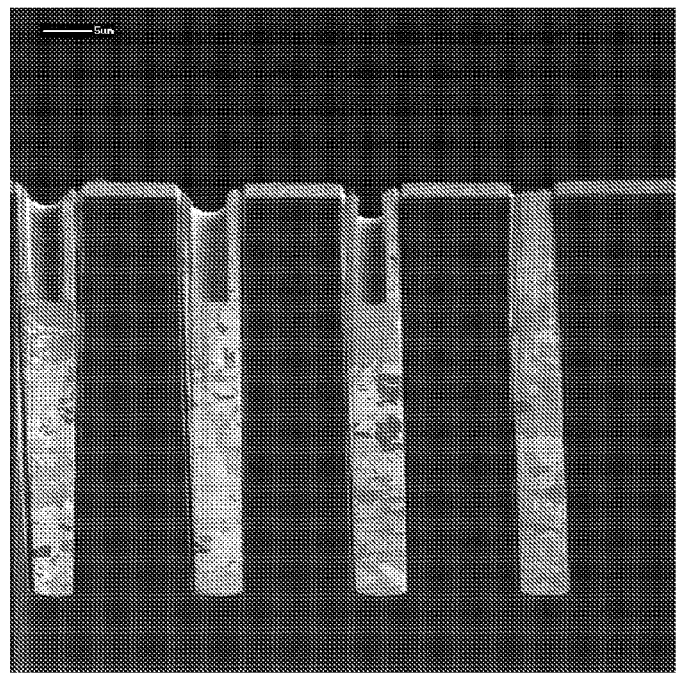
Figure 22D:
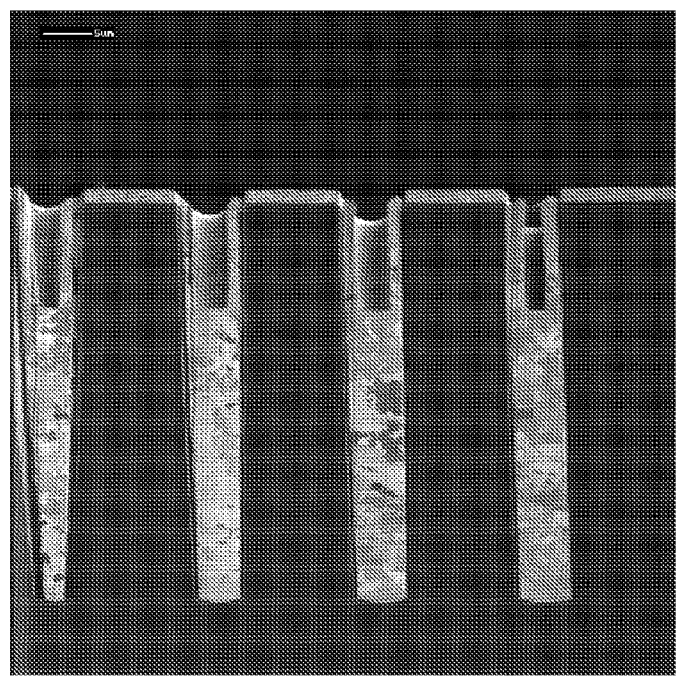

This composition was used to metallize vias having an aspect ratio of 10:1 (depth:opening diameter), resulting from an opening having a diameter of 6 micrometers and a total depth of 60 micrometers. The test wafers were degassed using MICROFAB® PW 1000 (available from Enthone Inc., West Haven, Conn.) and then immersed in the electrolytic copper deposition composition. The current density was 5 mA/cm². Plating was stopped after 30 minutes and the vias were inspected and photographed. FIGS. 18A and 18B are photographs of the metallized vias. Fill was void-free, and the increased current density enabled faster fill speed.

Example 10

Electrolytic Copper Composition and Deposition

An electrolytic copper deposition composition according to the present invention was prepared comprising the following components:

Copper sulfate (Source may be copper sulfate or any of its hydrates added in an amount sufficient to provide 55 g/L $Cu^{2+}$ ions)

Sulfuric acid (Concentrated, sufficient to provide 25 g/L $H_2SO_4$)

Chloride ion source (Source and amount sufficient to provide 50 ppm $Cl^-$)

ViaForm® Extreme Accelerator available from Enthone Inc. (0.5 mL/L of a stock solution comprising 3 g/L 3,3'-dithiobis(1-propanesulfonic acid, which is sufficient to provide 1.5 ppm Accelerator)

Leveler (Polymeric reaction product of 1,3-Bis(4-pyridyl)propane and 1-chloro-2-(2-chloroethoxy)ethane (Structure (48)); 4 mL/L)

Suppressor (Propoxylated glycerin having a molecular weight of about 700 g/mol; 5 mL/L).

This composition was used to metallize vias having an aspect ratio of 10:1 (depth:opening diameter), resulting from an opening having a diameter of 6 micrometers and a total depth of 60 micrometers. The test wafers were degassed using MICROFAB® PW 1000 (available from Enthone Inc., West Haven, Conn.) and then immersed in the electrolytic copper deposition composition. The current density was 4 mA/cm². Plating was stopped after 35 minutes and the vias were inspected. FIGS. 19A, 19B, 19C, and 19D are images obtained by focused ion beam of the metallized vias. The vias were about 70% filled, and the images show that fill was void-free.

Example 11

Electrolytic Copper Composition and Deposition

An electrolytic copper deposition composition according to the present invention was prepared comprising the following components:

Copper sulfate (Source may be copper sulfate or any of its hydrates added in an amount sufficient to provide 55 g/L $Cu^{2+}$ ions)

Sulfuric acid (Concentrated, sufficient to provide 100 g/L $H_2SO_4$)

Chloride ion source (Source and amount sufficient to provide 50 ppm $Cl^-$)

ViaForm® Extreme Accelerator available from Enthone Inc. (0.5 mL/L of a stock solution comprising 3 g/L 3,3'-dithiobis(1-propanesulfonic acid, which is sufficient to provide 1.5 ppm Accelerator)

Leveler (Polymeric reaction product of 1,3-Bis(4-pyridyl)propane and 1-chloro-2-(2-chloroethoxy)ethane (Structure (48)); 4 mL/L)

Suppressor (Propoxylated glycerin having a molecular weight of about 700 g/mol; 5 mL/L).

This composition was used to metallize vias having an aspect ratio of 10:1 (depth:opening diameter), resulting from an opening having a diameter of 6 micrometers and a total depth of 60 micrometers. The test wafers were degassed using MICROFAB® PW 1000 (available from Enthone Inc., West Haven, Conn.) and then immersed in the electrolytic copper deposition composition. The current density was 4 mA/cm². Plating was stopped after 35 minutes and the vias were inspected. FIGS. 20A, 20B, 20C, and 20D are images obtained by focused ion beam of the metallized vias. The vias were about 78% filled, and the images show that fill was void-free.

Example 12

Electrolytic Copper Composition and Deposition

An electrolytic copper deposition composition according to the present invention was prepared comprising the following components:

Copper sulfate (Source may be copper sulfate or any of its hydrates added in an amount sufficient to provide 55 g/L $Cu^{2+}$ ions)

Sulfuric acid (Concentrated, sufficient to provide 25 g/L $H_2SO_4$)

Chloride ion source (Source and amount sufficient to provide 50 ppm $Cl^-$)

ViaForm® Extreme Accelerator available from Enthone Inc. (0.5 mL/L of a stock solution comprising 3 g/L 3,3'-dithiobis(1-propanesulfonic acid, which is sufficient to provide 1.5 ppm Accelerator)

Leveler (Polymeric reaction product of 1,2-Bis(4-pyridyl)ethane and 1-chloro-2-(2-chloroethoxy)ethane (Structure (42)) having an average number of repeat units between 12 and 18; 4 mL/L)

Suppressor (Propoxylated glycerin having a molecular weight of about 700 g/mol; 5 mL/L).

This composition was used to metallize vias having an aspect ratio of 10:1 (depth:opening diameter), resulting from an opening having a diameter of 6 micrometers and a total depth of 60 micrometers. The test wafers were degassed using MICROFAB® PW 1000 (available from Enthone Inc., West Haven, Conn.) and then immersed in the electrolytic copper deposition composition. The current density was 4 mA/cm². Plating was stopped after 35 minutes and the vias were inspected. FIGS. 21A, 21B, 21C, and 21D are images obtained by focused ion beam of the metallized vias. The vias were about 74% filled, and the images show that fill was void-free.

Example 13

Electrolytic Copper Composition and Deposition

An electrolytic copper deposition composition according to the present invention was prepared comprising the following components:

Copper sulfate (Source may be copper sulfate or any of its hydrates added in an amount sufficient to provide 55 g/L $Cu^{2+}$ ions)

Sulfuric acid (Concentrated, sufficient to provide 100 g/L $H_2SO_4$)

Chloride ion source (Source and amount sufficient to provide 50 ppm $Cl^-$)

ViaForm® Extreme Accelerator available from Enthone Inc. (0.5 mL/L of a stock solution comprising 3 g/L 3,3'-dithiobis(1-propanesulfonic acid, which is sufficient to provide 1.5 ppm Accelerator)

Leveler (Polymeric reaction product of 1,2-Bis(4-pyridyl)ethane and 1-chloro-2-(2-chloroethoxy)ethane (Structure (42)) having an average number of repeat units between 12 and 18; 4 mL/L)

Suppressor (Propoxylated glycerin having a molecular weight of about 700 g/mol; 5 mL/L).

This composition was used to metallize vias having an aspect ratio of 10:1 (depth:opening diameter), resulting from an opening having a diameter of 6 micrometers and a total depth of 60 micrometers. The test wafers were degassed using MICROFAB® PW 1000 (available from Enthone Inc., West Haven, Conn.) and then immersed in the electrolytic copper deposition composition. The current density was 4 mA/cm². Plating was stopped after 35 minutes and the vias were inspected. FIGS. 22A, 22B, 22C, and 22D are images obtained by focused ion beam of the metallized vias. The vias were about 72% filled, and the images show that fill was void-free.

Example 14

Copper Deposit Purity

Two electrolytic copper deposition compositions according to the present invention were prepared comprising the following components:

Copper sulfate (Source may be copper sulfate or any of its hydrates added in an amount sufficient to provide 55 g/L $Cu^{2+}$ ions)

Sulfuric acid (Concentrated, sufficient to provide 100 g/L $H_2SO_4$)

Chloride ion source (Source and amount sufficient to provide 50 ppm $Cl^-$)

ViaForm® Extreme Accelerator available from Enthone Inc. (0.5 mL/L of a stock solution comprising 3 g/L 3,3'-dithiobis(1-propanesulfonic acid, which is sufficient to provide 1.5 ppm Accelerator)

Suppressor (Propoxylated glycerin having a molecular weight of about 700 g/mol; 5 mL/L).

A first composition, designated A in the below Table, was prepared with the leveler comprising the polymeric reaction product of 1,2-Bis(4-pyridyl)ethane and 1-chloro-2-(2-chloroethoxy)ethane (Structure (42)) having an average number of repeat units between 12 and 18 (4 mL/L).

A second composition, designated B in the below table, was prepared with the leveler comprising the polymeric reaction product of 1,3-Bis(4-pyridyl)propane and 1-chloro-2-(2-chloroethoxy)ethane (Structure (48)) (4 mL/L).

Copper was deposited from each composition at 4 mA/cm² and the sulfur, chloride, nitrogen, oxygen, and carbon contents of each were determined by SIMS. The following table displays the concentrations in ppm of each elemental impurity.

| Composition | S (ppm) | Cl (ppm) | N (ppm) | O (ppm) | C (ppm) | Total (ppm) |
|---|---|---|---|---|---|---|
| A | 1.02 | 1.58 | 0.35 | 8.02 | 14.66 | 25.63 |
| B | 0.49 | 0.04 | 0.09 | 7.11 | 11.09 | 18.82 |

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above compositions and processes without departing from the scope of the invention, it is intended that all matter contained in the above description and shown in the accompanying drawings shall be interpreted as illustrative and not in a limiting sense.

What is claimed is:

1. A method for metallizing a through silicon via feature in a semiconductor integrated circuit device substrate, wherein the semiconductor integrated circuit device substrate comprises a front surface, a back surface, and the through silicon via feature and wherein the through silicon via feature comprises an opening in the front surface of the substrate, a sidewall extending from the front surface of the substrate, and a bottom, the method comprising:
   immersing the semiconductor integrated circuit device substrate into an electrolytic copper deposition composition, wherein the through silicon via feature has an entry dimension between 1 micrometer and 100 micrometers, a depth dimension between 20 micrometers and 750 micrometers, and an aspect ratio greater than about 2:1, the deposition composition comprising:
      (a) a source of copper ions;
      (b) an acid selected from among an inorganic acid, organic sulfonic acid, and mixtures thereof;
      (c) a quaternized dipyridyl polymer compound; and
      (d) chloride ions; and
   supplying electrical current to the electrolytic deposition composition to deposit copper metal onto the bottom and sidewall for bottom-up filling to thereby yield a copper filled through silicon via feature.

2. The method of claim 1 wherein the quaternized dipyridyl polymer is derived from a dipyridyl compound having the following structure:

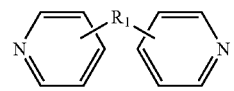

wherein $R_1$ is a moiety that connects the pyridine rings.

3. The method of claim 2 wherein the quaternized dipyridyl polymer is derived from a compound that comprises the general structure:

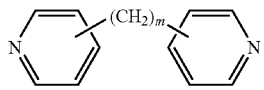

wherein m is an integer from 0 to 6.

4. The method of claim 3 wherein the quaternized dipyridyl polymer is derived from a compound that comprises one of the following structures:

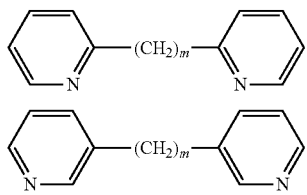

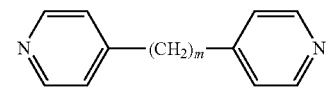

wherein m is an integer from 0 to 6.

5. The method of claim 1 wherein the quaternized dipyridyl polymer is derived from a dipyridyl compound having one of the following structures:

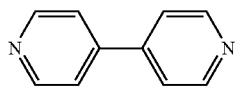

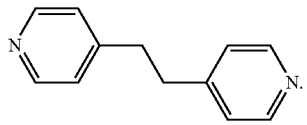 [SMILES: c1cc(CCc2ccncc2)ccn1]

6. The method of claim 1 wherein the quaternized dipyridyl polymer is derived from a dipyridyl compound having the following structure:

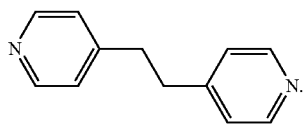

7. The method of claim 1 wherein the quaternized dipyridyl polymer is derived from a dipyridyl compound having the following structure:

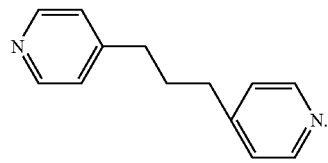

8. The method of claim 1 wherein the quaternized dipyridyl polymer is derived from a dipyridyl compound having the following structure:

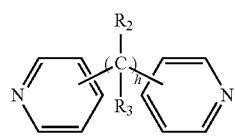

wherein h is an integer from 0 to 6, and $R_2$ and $R_3$ are each independently selected from among hydrogen or a short alkyl chain having from 1 to about 3 carbon atoms.

9. The method of claim 1 wherein the quaternized dipyridyl polymer is derived from a dipyridyl compound having the following structure:

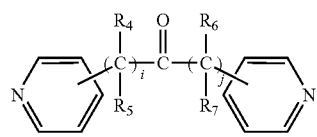

wherein i and j are integers from 0 to 6, and $R_4$, $R_5$, $R_6$, and $R_7$ are each independently selected from among hydrogen or a short alkyl chain having from 1 to about 3 carbon atoms.

10. The method of claim 9 wherein i and j are both 0, and the dipyridyl polymer is derived from a compound that comprises one of the following structures:

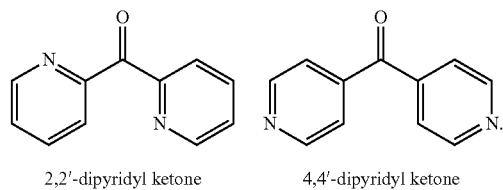

2,2'-dipyridyl ketone      4,4'-dipyridyl ketone

11. The method of claim 1 wherein the quaternized dipyridyl polymer is derived from a dipyridyl compound having the following structure:

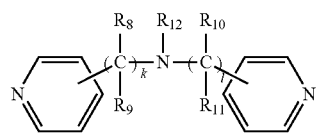

wherein k and l are integers from 0 to 6, and $R_8$, $R_9$, $R_{10}$, $R_{11}$, and $R_{12}$ are each independently selected from among hydrogen or a short alkyl chain having from 1 to about 3 carbon atoms.

12. The method of claim 1 wherein the quaternized dipyridyl polymer is derived from a dipyridyl compound having the following structure:

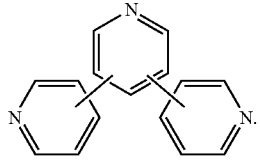

13. The method of claim 1 wherein the quaternized dipyridyl polymer compound is a reaction product of a dipyridyl and an alkylating agent comprising the following structure:

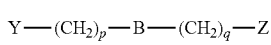

wherein
    B is selected from among:
        a single bond, an oxygen atom

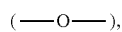

a methenyl hydroxide

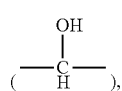

a carbonyl

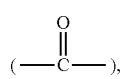

an amino

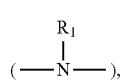

an imino

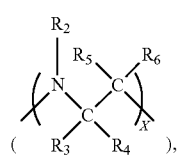

a sulfur atom

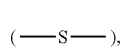

a sulfoxide

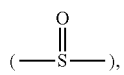

a phenylene

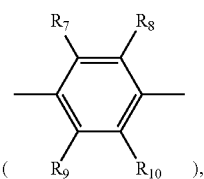

and a glycol

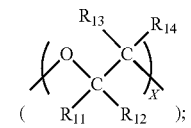

and
    p and q may be the same or different, are integers between 0 and 6, wherein at least one of p and q is at least 1;
    X is an integer from one to about four;
    Y and Z are leaving groups selected from among chloride, bromide, iodide, tosyl, triflate, sulfonate, mesylate, methosulfate, fluorosulfonate, methyl tosylate, brosylate, or nosylate; and
    $R_1$ through $R_{14}$ are each independently hydrogen, substituted or unsubstituted alkyl having from one to six carbon atoms, substituted or unsubstituted alkylene having from one to six carbon atoms, or substituted or unsubstituted aryl.

14. The method of claim 13 wherein:
    p and q are both one or are both two; and
    B is selected from among:
    an oxygen atom

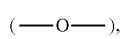

a methenyl hydroxide

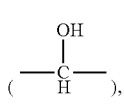

a carbonyl

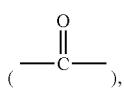

a phenylene group

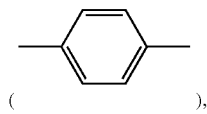, an ethylene glycol group

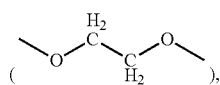, and
a propylene glycol group

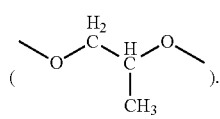.

15. A composition for metallizing a through silicon via feature in a semiconductor integrated circuit device substrate comprising:
   (a) a source of copper ions;
   (b) an acid selected from among an inorganic acid, organic sulfonic acid, and mixtures thereof;
   (c) a quaternized dipyridyl polymer compound; and
   (d) chloride ions.

16. A composition as set forth in claim 15 further comprising a suppressor.

17. A composition as set forth in claim 15 wherein said quaternized dipyridyl polymer compound comprises the product of the reaction between a dipyridyl compound and an alkylating agent.

18. A composition as set forth in claim 15 wherein said dipyridyl polymer is the reaction product of a dipyridyl compound and an alkylating agent comprising the following structure:

$$Y-(CH_2)_p-B-(CH_2)_q-Z$$

wherein
B is selected from among:
a single bond, an oxygen atom (—O—), a methenyl hydroxide

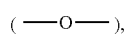, a carbonyl

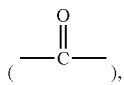, an amino

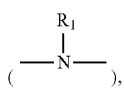, an imino

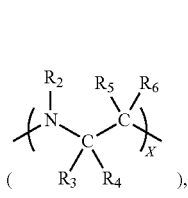, a sulfur atom (—S—), a sulfoxide

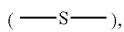, a phenylene

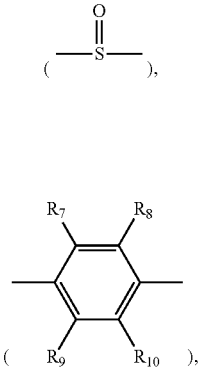, and a glycol

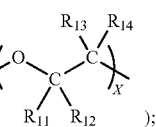;

and
p and q may be the same or different, are integers between 0 and 6, wherein at least one of p and q is at least 1;
X is an integer from one to about four;
Y and Z are leaving groups selected from among chloride, bromide, iodide, tosyl, triflate, sulfonate, mesylate, methosulfate, fluorosulfonate, methyl tosylate, brosylate, or nosylate; and
$R_1$ through $R_{14}$ are each independently hydrogen, substituted or unsubstituted alkyl having from one to six carbon atoms, substituted or unsubstituted alkylene having from one to six carbon atoms, or substituted or unsubstituted aryl.

19. A composition as set forth in claim 15 wherein the quaternized dipyridyl polymer compound comprises the polymeric reaction product of 1,2-Bis(4-pyridyl)ethane and 1-chloro-2-(2-chloroethoxy)ethane.

* * * * *